US011670692B2

(12) United States Patent
Hsu et al.

(10) Patent No.: US 11,670,692 B2
(45) Date of Patent: Jun. 6, 2023

(54) GATE-ALL-AROUND DEVICES HAVING SELF-ALIGNED CAPPING BETWEEN CHANNEL AND BACKSIDE POWER RAIL

(71) Applicant: Taiwan Semiconductor Manufacturing Co., Ltd., Hsinchu (TW)

(72) Inventors: Chung-Wei Hsu, Hsinchu (TW); Lung-Kun Chu, New Taipei (TW); Mao-Lin Huang, Hsinchu (TW); Jia-Ni Yu, Hsinchu (TW); Kuo-Cheng Chiang, Hsinchu County (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 38 days.

(21) Appl. No.: 17/218,503

(22) Filed: Mar. 31, 2021

(65) Prior Publication Data

US 2021/0359091 A1    Nov. 18, 2021

Related U.S. Application Data

(60) Provisional application No. 63/024,167, filed on May 13, 2020.

(51) Int. Cl.
*H01L 29/417* (2006.01)
*H01L 29/786* (2006.01)
(Continued)

(52) U.S. Cl.
CPC ........... *H01L 29/41733* (2013.01); *H01L 21/823412* (2013.01); *H01L 21/823418* (2013.01);
(Continued)

(58) Field of Classification Search
CPC ......... H01L 29/42392; H01L 29/78696; H01L 21/823475; H01L 21/76897; H01L 29/0653
See application file for complete search history.

(56) References Cited

U.S. PATENT DOCUMENTS 8,772,109 B2   7/2014   Colinge
8,785,285 B2   7/2014   Tsai et al.
(Continued)

FOREIGN PATENT DOCUMENTS

CN   110783200 A   2/2020
TW   201923849 A   6/2019

OTHER PUBLICATIONS

Chen, Chun-Yuan et al., "Semiconductor Devices with Backside Air Gap Dielectric", U.S. Appl. No. 16/888,217, filed May 29, 2020, Assignee Taiwan Semiconductor Manufacturing Co., Ltd., 26 pages specification, 16 pages drawings.
(Continued)

*Primary Examiner* — Changhyun Yi
(74) *Attorney, Agent, or Firm* — Haynes and Boone, LLP

(57) ABSTRACT

A semiconductor device includes power rails in a first interconnect structure on a backside of the semiconductor device. The semiconductor device further includes a gate-all-around (GAA) transistor having multiple channel layers stacked over the first interconnect structure, a gate stack wrapping around each of the multiple channel layers except a bottommost one of the multiple channel layers, and a source/drain feature adjoining the channel layers. The semiconductor device further includes a first conductive via connecting the first interconnect structure to a bottom of the source/drain feature and a dielectric feature isolating the bottommost one of the multiple channel layers from the first conductive via.

20 Claims, 30 Drawing Sheets

(51) Int. Cl.
   *H01L 29/423* (2006.01)
   *H01L 21/8234* (2006.01)
(52) U.S. Cl.
   CPC .............. *H01L 21/823437* (2013.01); *H01L 21/823475* (2013.01); *H01L 29/42392* (2013.01); *H01L 29/78696* (2013.01)

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,816,444 B2 | 8/2014 | Wann et al. |
| 8,823,065 B2 | 9/2014 | Wang et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,962,400 B2 | 2/2015 | Tsai et al. |
| 8,993,380 B2 | 3/2015 | Hou et al. |
| 9,093,514 B2 | 7/2015 | Tsai et al. |
| 9,105,490 B2 | 8/2015 | Wang et al. |
| 9,236,267 B2 | 1/2016 | De et al. |
| 9,236,300 B2 | 1/2016 | Liaw |
| 9,245,805 B2 | 1/2016 | Yeh et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,520,482 B1 | 12/2016 | Chang et al. |
| 9,576,814 B2 | 2/2017 | Wu et al. |
| 9,704,835 B2 | 7/2017 | Feng et al. |
| 9,711,555 B2 | 7/2017 | Lin et al. |
| 9,818,872 B2 | 11/2017 | Ching et al. |
| 9,887,269 B2 | 2/2018 | Ching et al. |
| 9,899,398 B1 | 2/2018 | Colinge et al. |
| 10,020,261 B2 | 7/2018 | Wu et al. |
| 10,032,627 B2 | 7/2018 | Lee et al. |
| 10,109,721 B2 | 10/2018 | Lin et al. |
| 10,157,999 B2 | 12/2018 | Ching et al. |
| 10,199,502 B2 | 2/2019 | Huang et al. |
| 10,269,715 B2 | 4/2019 | Wu et al. |
| 10,282,504 B2 | 5/2019 | Wu et al. |
| 2018/0175036 A1 | 6/2018 | Ching et al. |
| 2019/0067125 A1 | 2/2019 | Chiang et al. |
| 2019/0109040 A1 | 4/2019 | Chao et al. |
| 2020/0083326 A1 | 3/2020 | Ok et al. |
| 2020/0126987 A1* | 4/2020 | Rubin ................ H01L 29/0847 |
| 2021/0408246 A1* | 12/2021 | Ganguly .............. H01L 29/401 |

OTHER PUBLICATIONS

Su, Huan-Chieh et al., "Backside Power Rail and Methods of Forming the Same", U.S. Appl. No. 16/901,963, filed Jun. 15, 2020, Assignee Taiwan Semiconductor Manufacturing Co., Ltd., 28 pages specification, 22 pages drawings.

Chen, Chun-Yuan et al., Anchor-Shaped Backside Via and Method Thereof, U.S. Appl. No. 16/926,447, filed Jul. 10, 2020, Assignee Taiwan Semiconductor Manufacturing Co., Ltd., 32 pages specification, 16 pages drawings.

Yu, Jia-Ni, et al., "P-Metal Gate First Gate Replacement Process for Multigate Devices", U.S. Appl. No. 16/834,637, filed Mar. 30, 2020, 43 pages of specification, 24 pages of drawings.

Huang, Mao-Lin, et al., "Gate Patterning Process for Multi-Gate Devices", U.S. Appl. No. 16/858,440, filed Apr. 24, 2020. 32 pages of specification and 38 pages of drawings.

Huang, Wang-Chun, et al., "Semiconductor Devices with Improved Capacitors", U.S. Appl. No. 16/802,396, filed Feb. 26, 2020, 30 pages of specification and 29 pages of drawings.

Lou, Qiaowei, et al., "Optical Emission Spectroscopic Studies and Comparisons of CH3F/CO2 and CH3F/O2 Unductively Coupled Plasmas", Plasma Processing Laboratory, Department of Chemical and Biomolecular Engineering University of Houston, Manuscript # JVSTA-A-14-332.

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

Chen, Hsin-Ping, et al., "Semiconductor Device with Conductors Embedded in a Substrate", U.S. Appl. No. 16/751,158, filed Jan. 24, 2020, Assignee: Taiwan Semiconductor Manufacturing Co., Ltd., 29 pages specification, 19 pages drawings.

Chu, Lung-Kun, et al., "Dipole Patterning for CMOS Devices", U.S. Appl. No. 16/879,613, filed May 19, 2020, Assignee: Taiwan Semiconductor Manufacturing Co., Ltd., 27 pages specification, 26 pages drawings.

Chiang, Kuo-Cheng, et al. "Semiconductor Devices with Backside Power Rail and Backside Self-Aligned Via", U.S. Appl. No. 17/080,521, filed Oct. 25, 2020, Assignee: Taiwan Semiconductor Manufacturing Co., Ltd., 37 pages specification, 24 pages drawings.

* cited by examiner

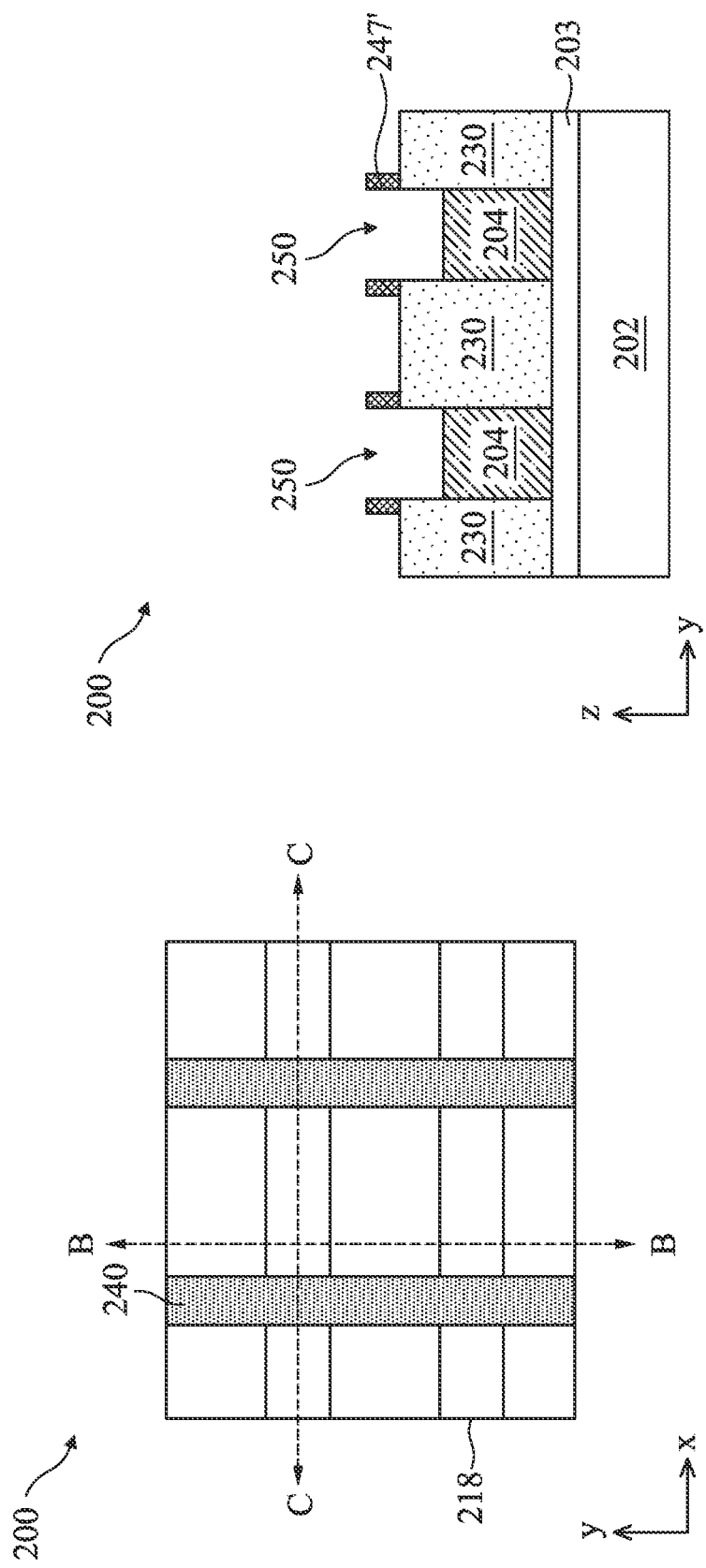

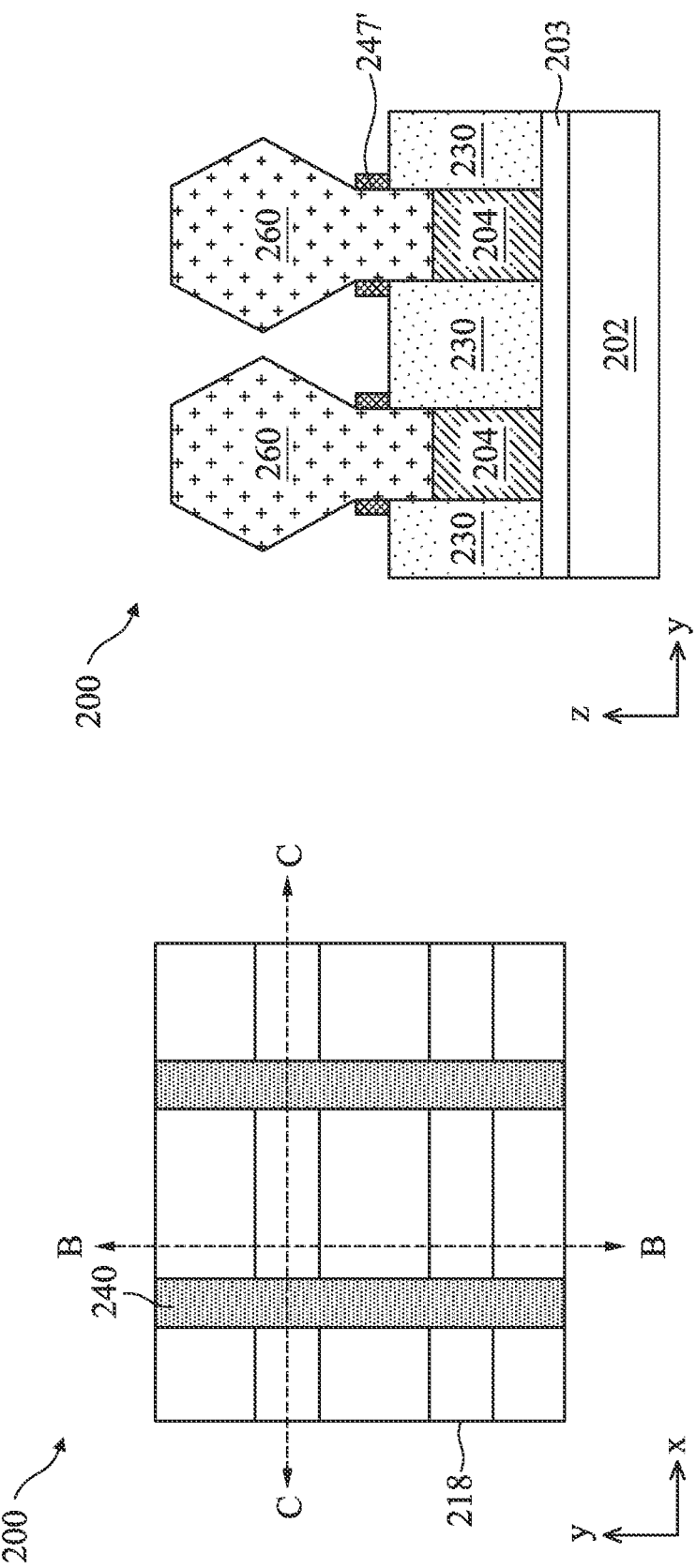

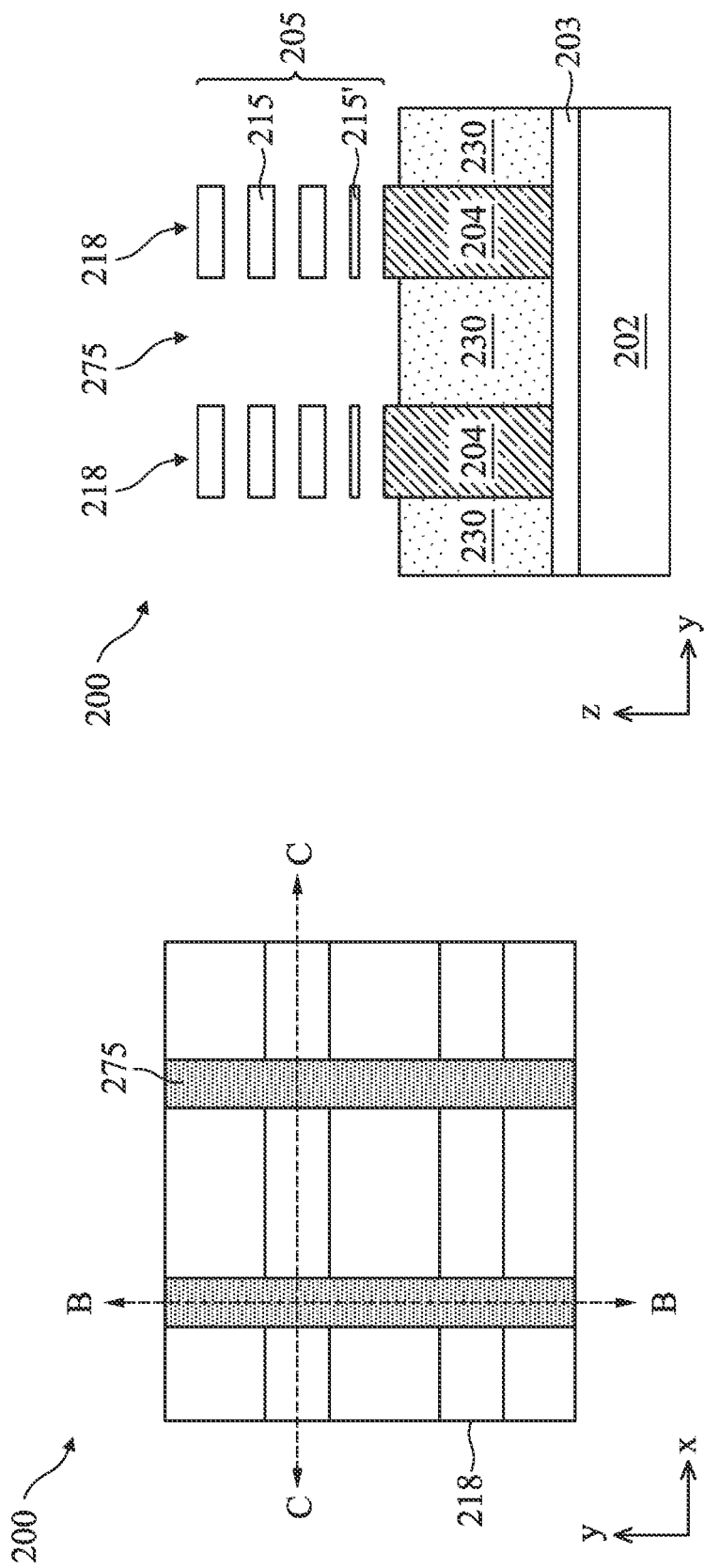

GATE-ALL-AROUND DEVICES HAVING SELF-ALIGNED CAPPING BETWEEN CHANNEL AND BACKSIDE POWER RAIL

PRIORITY

This application claims the benefits to U.S. Provisional Application Ser. No. 63/024,167 filed May 13, 2020, the entire disclosure of which is incorporated herein by reference.

BACKGROUND

Conventionally, integrated circuits (IC) are built in a stacked-up fashion, having transistors at the lowest level and interconnect (vias and wires) on top of the transistors to provide connectivity to the transistors. Power rails (e.g., metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects. One area of interests is how to create semiconductor devices with backside power rails and to isolate backside power rails from frontside components such as metal gates.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 5A, 6A, 7A, 8A, 9A, 10A, and 19A illustrate top views of a portion of a semiconductor device, according to some embodiments.

FIGS. 4B, 5B, 5C, 6B, 6C, 7B, 7C, 8B, 8C, 9B, 9C, 10B, 10C, 11, 12A, 12B, 12C, 13A, 13B, 13C, 13D, 19B, 19C, 19D, 20B, 20C, 20D, and 21B illustrate cross-sectional views of a portion of a semiconductor device, according to some embodiments.

FIGS. 14, 15, 16, 17, 18, 20A, and 21A illustrate perspective views of a portion of a semiconductor device, according to some embodiments.

DETAILED DESCRIPTION

Figure 1A:
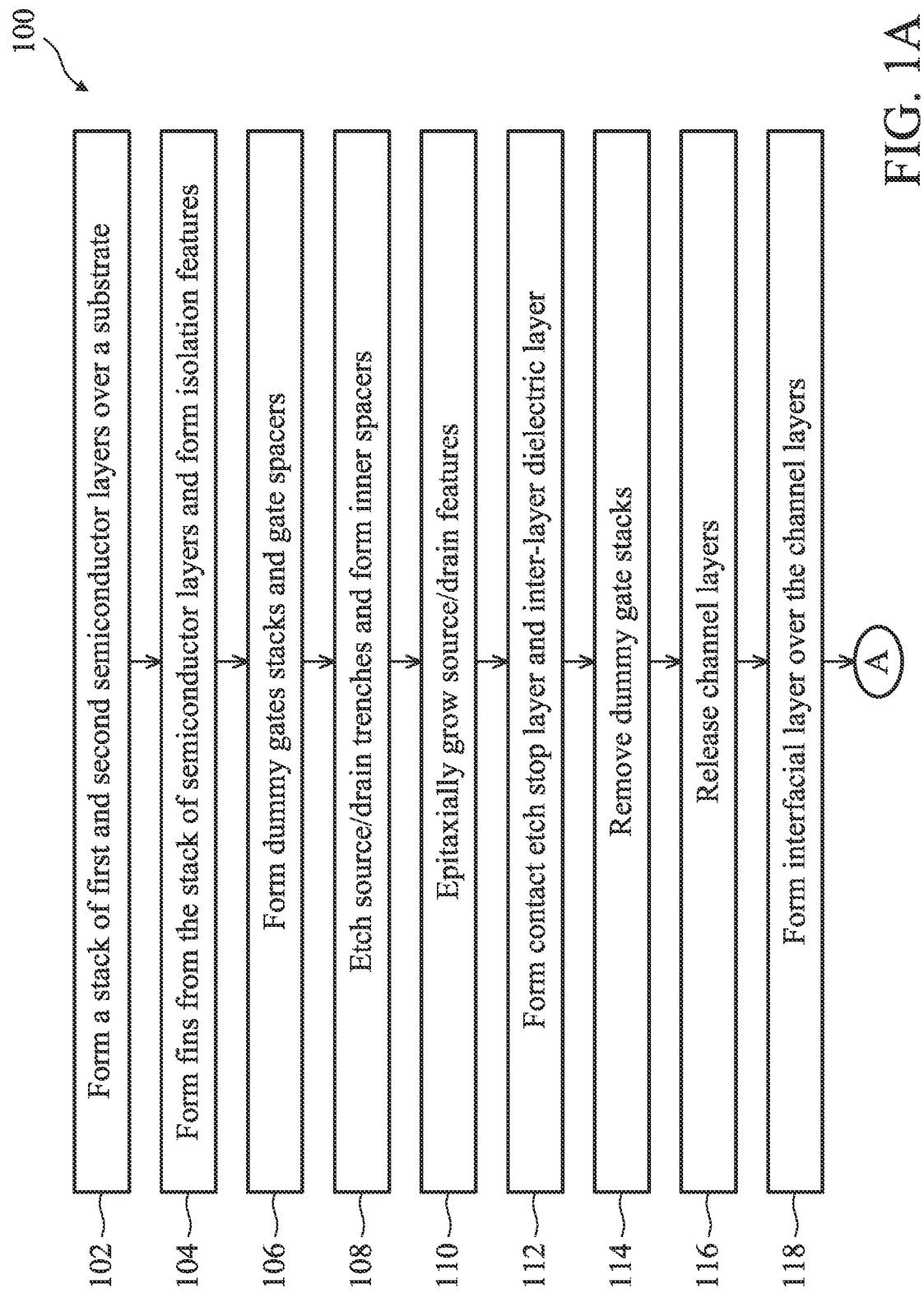
FIGS. 1A, 1B, 1C, and 1D show flow charts of a method of forming a semiconductor device with backside power rails and backside self-aligned vias, according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside power rails and backside self-aligned vias. As discussed above, power rails in IC need further improvement in order to provide the needed performance boost as well as reducing power consumption. An object of the present disclosure includes providing power rails (or power routings) on a back side (or backside) of a structure containing transistors (such as gate-all-around (GAA) transistors) in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. The present disclosure also provides structures and methods for isolating the backside power rails from frontside components such as metal gates. The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. Those of ordinary skill in the art should appreciate that they may readily use the present disclosure as a basis for designing or modifying other processes and structures for carrying out the same purposes and/or achieving the same advantages of the embodiments introduced herein.

Figure 1B:
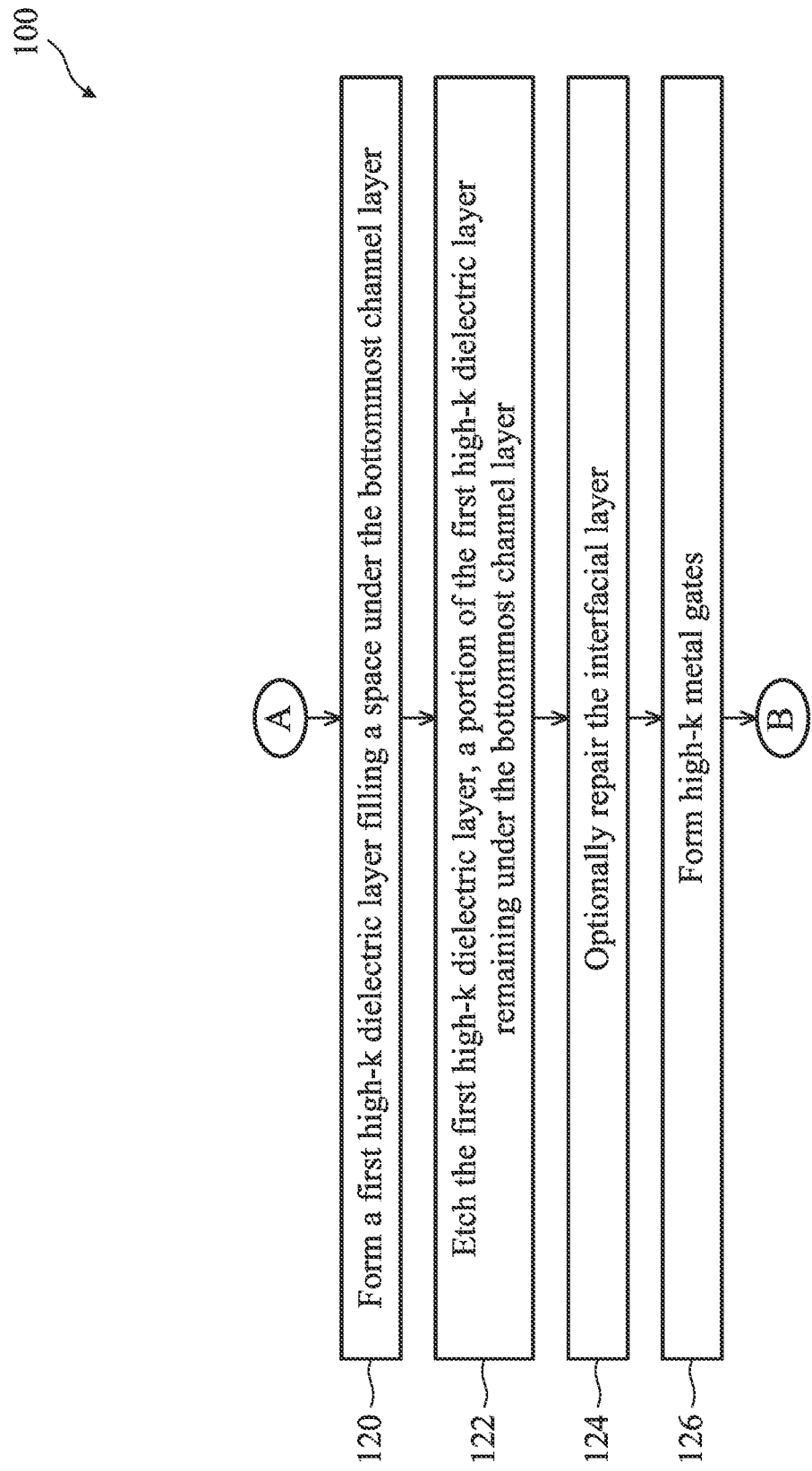
Figure 1C:
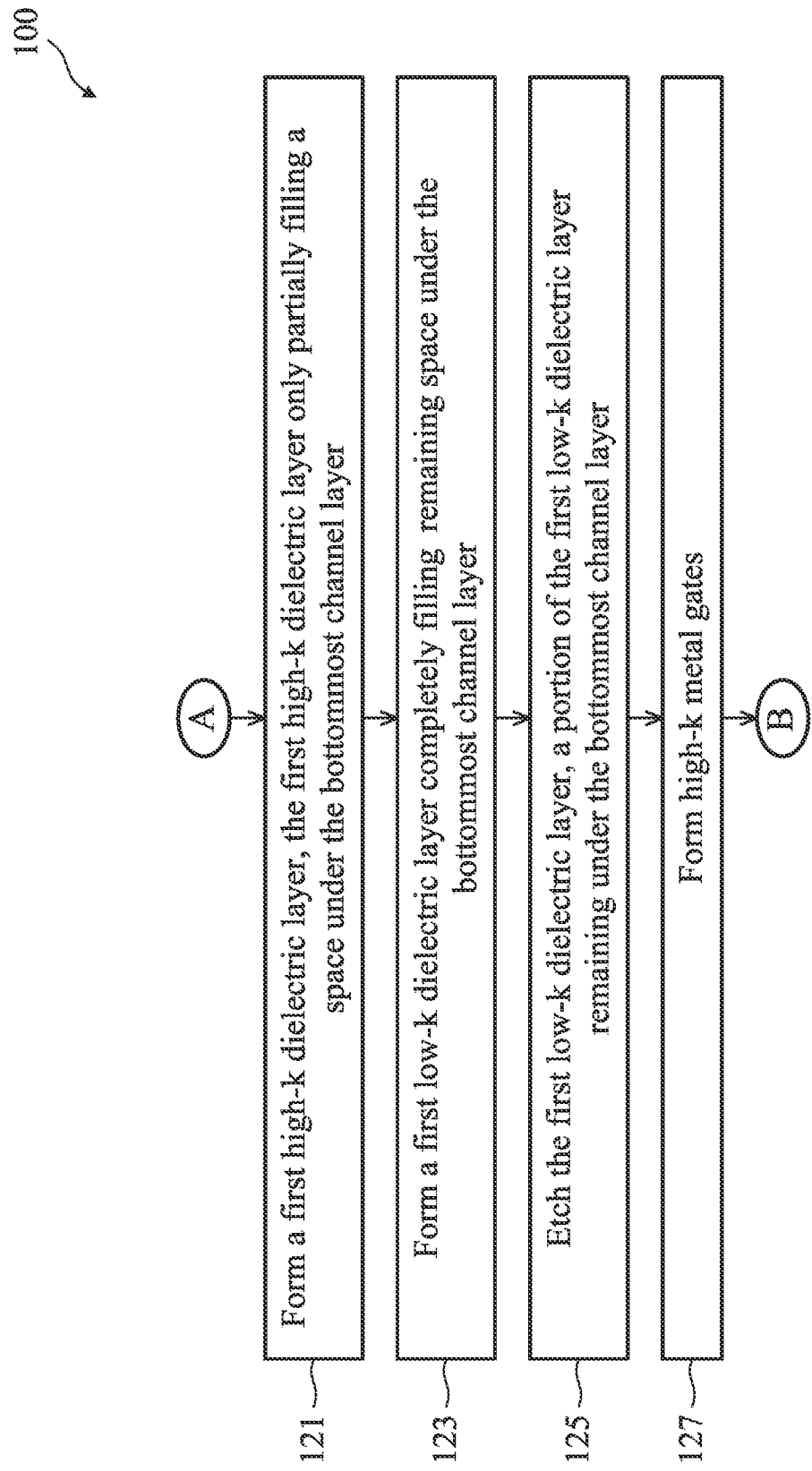
Figure 1D:
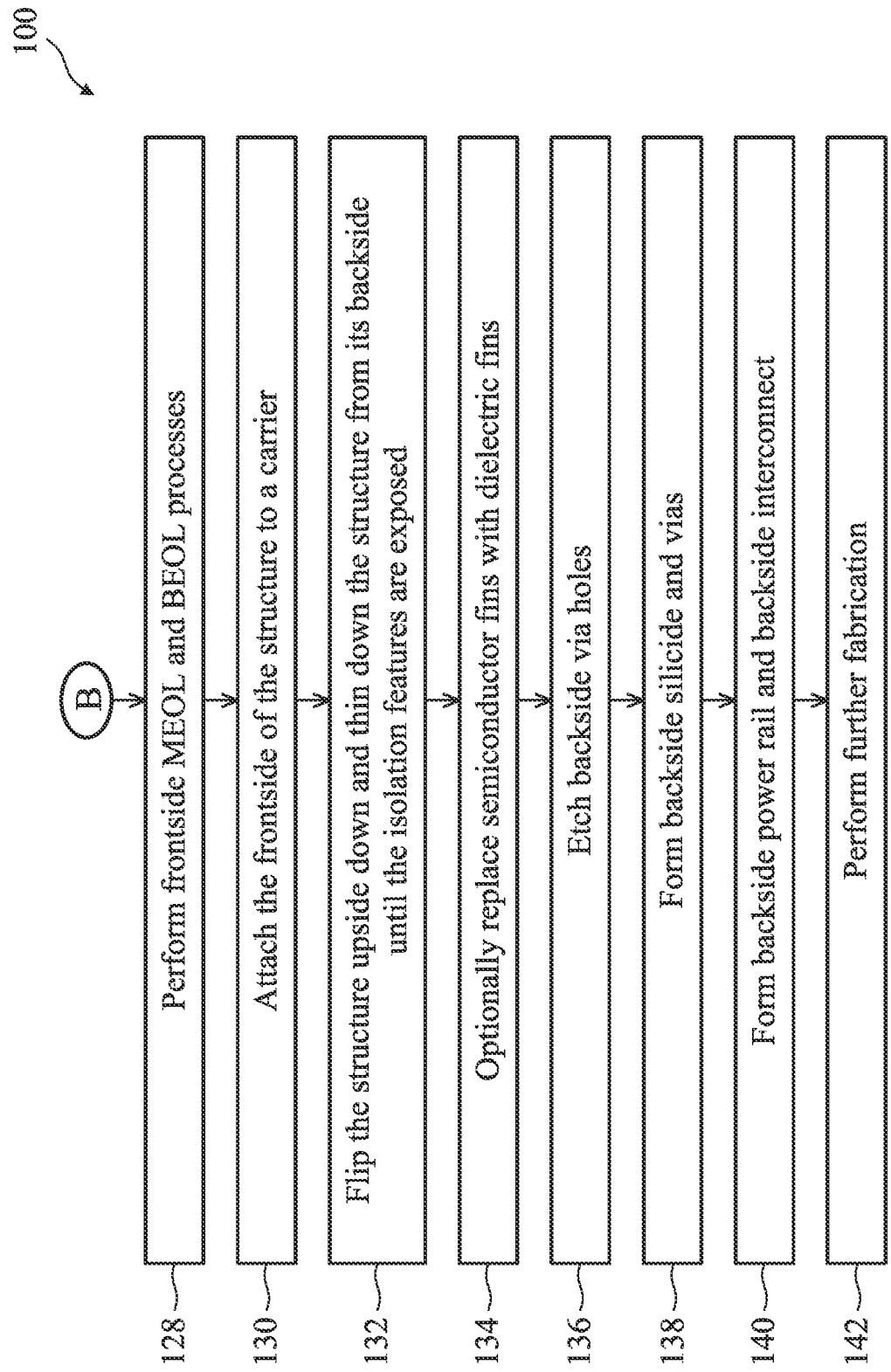

FIGS. 1A, 1B, and 1D are a flow chart of a method 100 for fabricating a semiconductor device according to an embodiment of the present disclosure. FIGS. 1A, 1C, and 1D are a flow chart of the method 100 for fabricating a semiconductor device according to an alternative embodiment of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2 through FIG. 21B that illustrate various top, cross-sectional, and perspective views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2 through 21B have been simplified for the sake of clarity to better understand the inventive concepts of the present disclosure. Additional features can be added in the device 200, and some of the features described below can be replaced, modified, or eliminated in other embodiments of the device 200.

Figure 3:
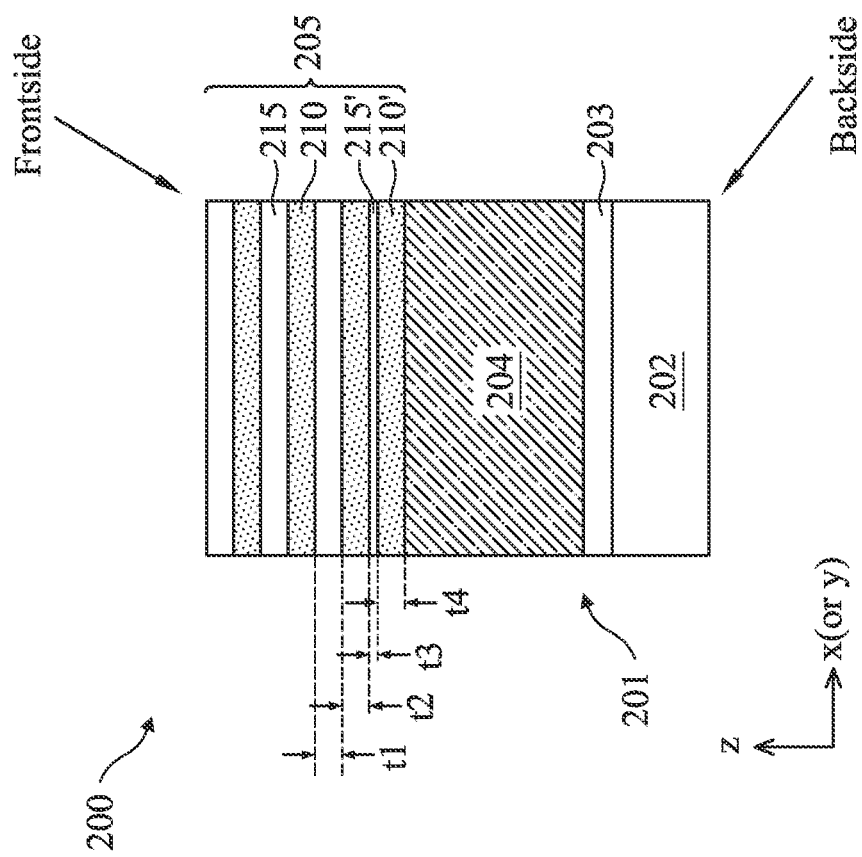
FIGS. 2 and 3 illustrate cross-sectional views of a portion of a semiconductor device, according to some embodiments, in intermediate steps of fabrication according to an embodiment of the method of FIGS. 1A-1D.
Figure 2:
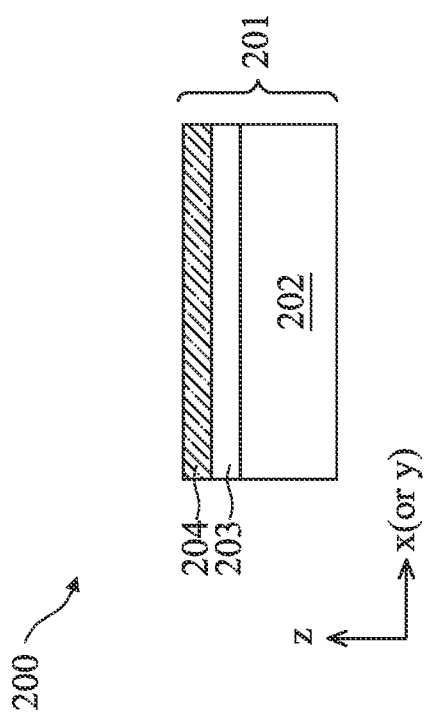

At operation 102, the method 100 (FIG. 1A) forms a stack 205 of first and second semiconductor layers over a substrate 201. The resultant structure is shown in FIGS. 2 and 3 according to an embodiment. Particularly, FIG. 2 illustrates the substrate 201 in an embodiment, and FIG. 3 illustrates a stack 205 of semiconductor layers 210 and 215 in an embodiment. In the depicted embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In the depicted embodiment, the substrate 201 includes a semiconductor layer 204, an insulator 203, and a carrier 202. In embodiments, the semiconductor layer 204 can be silicon, silicon germanium, germanium, or other suitable semiconductor. The semiconductor layer 204 may be doped in some embodiments or undoped in some alternative embodiments. In the present embodiment, the semiconductor layer 204 functions as a seed layer for epitaxially growing the semiconductor layer stack 205. The carrier 202 may be part of a silicon wafer and the insulator 203 may be silicon oxide. In an alternative embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

The semiconductor layer stack 205 includes semiconductor layers 210 and semiconductor layers 215 stacked vertically (e.g., along the z-direction) in an interleaving or alternating configuration from a surface of the substrate 201. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 210, a second one of semiconductor layers 210 is epitaxially grown on the first one of semiconductor layers 215, and so on until semiconductor layers stack 205 has a desired number of semiconductor layers 210 and semiconductor layers 215. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In various embodiments, semiconductor layers 210 and semiconductor layers 215 include different materials, different constituent atomic percentages, different constituent weight percentages, and/or other different characteristics to achieve desired etching selectivity during an etching process, such as an etching process implemented to selectively remove the semiconductor layers 210. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of the device 200. In the depicted embodiment, semiconductor layer stack 205 includes four semiconductor layers 210 and four semiconductor layers 215. However, the present disclosure contemplates embodiments where semiconductor layer stack 205 includes more or less semiconductor layers, for example, depending on a number of channels desired for the device 200 (e.g., a GAA transistor) and/or design requirements of the device 200. For example, semiconductor layer stack 205 can include two to ten semiconductor layers 210 and two to ten semiconductor layers 215. As will be discussed, the method 100 will process layers at both sides of the substrate 201. In the present disclosure, the side of the substrate 201 where the stack 205 resides is referred to as the frontside and the side opposite the frontside is referred to as the backside.

In the present embodiment, the bottommost layer of the semiconductor layers 215 is thinner than other semiconductor layers 215. Thus, it is labeled as semiconductor layer 215' to distinguish it from other semiconductor layers 215 in the following discussion. Further, the bottommost layer of the semiconductor layers 210 is thinner than other semiconductor layers 210. Thus, it is labeled as semiconductor layer 210' to distinguish it from other semiconductor layers 210 in the following discussion. The semiconductor layers 215 each have a thickness t1, the semiconductor layers 210 each have a thickness t2, the semiconductor layer 215' has a thickness t3, and the semiconductor layer 210' has a thickness t4. In the present embodiment, t1 is greater than t3 and t2 is greater than t4.

As will be discussed, each of the semiconductor layers 215 will be fully wrapped around (for example, at its top, bottom, and sidewalls) by a metal gate for excellent short channel control, but the semiconductor layer 215' is not fully wrapped around by the metal gate. For example, the metal gate is not disposed under at least a portion of the semiconductor layer 215'. Thus, gate control of the semiconductor layer 215' may not be as good as that of the semiconductor layers 215. Therefore, making the semiconductor layer 215' thinner than the semiconductor layers 215 (i.e., t3<t1) reduces leakage current (due to sub-channel effects) through the semiconductor layer 215'. In some embodiments, the thickness t1 may be in a range of about 4 nm to about 6 nm, the thicknesses t3 may be in a range of about 1 nm to about 4 nm, while it is maintained that t3 is smaller than t1. In some embodiments, a ratio of t3 to t1 is in a range of greater than 0.33 and less than 1. If the ratio is too small (such as less than 0.33), the layer 215' may be too thin in some instances to sustain various oxidation and etching processes. Without the layer 215', the uniformity among the channel layers 215 might be degraded in some instances.

As will be discussed, the semiconductor layers 210 and 210' will be removed at subsequent fabrication steps and one or more dielectric materials will be deposited into the space occupied by the semiconductor layers 210 and 210'. In the present embodiment, the one or more dielectric materials will fully fill the space occupied by the semiconductor layer 210' but do not fully fill the space occupied by the semiconductor layers 210. To achieve that objective, the thickness t2 is designed to be greater than the thickness t4. In some embodiment, the thickness t2 is greater than the thickness t4 by about 3 nm to about 6 nm. If the difference is too small (e.g., if t2−t4<3 nm), it might be difficult to control the thickness of the one or more dielectric materials during deposition and the process margin might be very small in some instances, which might adversely affect the product yield. If the difference is too large (e.g., if t2−t4>6 nm), it might make the metal gate (which surrounds the layers 215) unnecessarily tall and the device dimension unnecessarily large, which might adversely affect device integration density for some implementations. In some embodiments, the thickness t4 is designed to be about 2 nm to about 5 nm, while t2 is designed to be greater than t4 by about 3 nm to about 6 nm. As will be discussed, the thickness t4 determines a thickness of a dielectric feature replacing the semiconductor layer 210' and the dielectric feature functions to isolate backside power rails from frontside metal gates. If the thickness t4 is too small (such as less than 2 nm) or too large (such as more than 5 nm), it might be difficult to fully fill the space occupied by the layer 210' with dielectric material(s) or the dielectric feature might not provide sufficient isolation for TDDB (Time Dependent Dielectric Breakdown) performance purposes. In some embodiments, a ratio of t4 to t2 is designed to be in a range of about 0.33 to about 0.6. Again, if this ratio is too small (such as less than 0.33) or too large (such as more than 0.6), it might be difficult to fully fill the space occupied by the layer 210' with dielectric material(s) or the dielectric feature might not provide sufficient isolation for TDDB performance purposes.

Figure 4B:
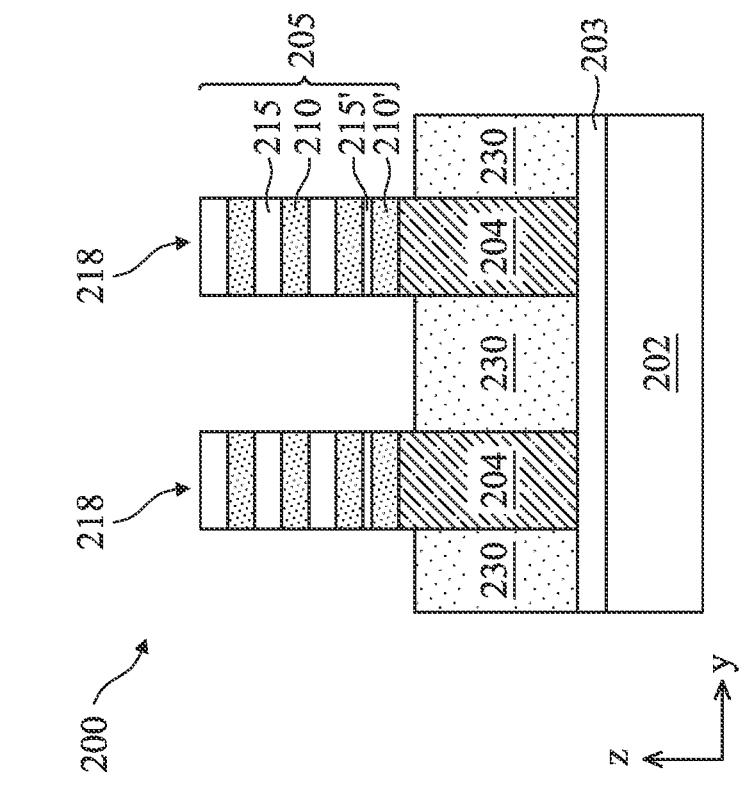
Figure 4A:
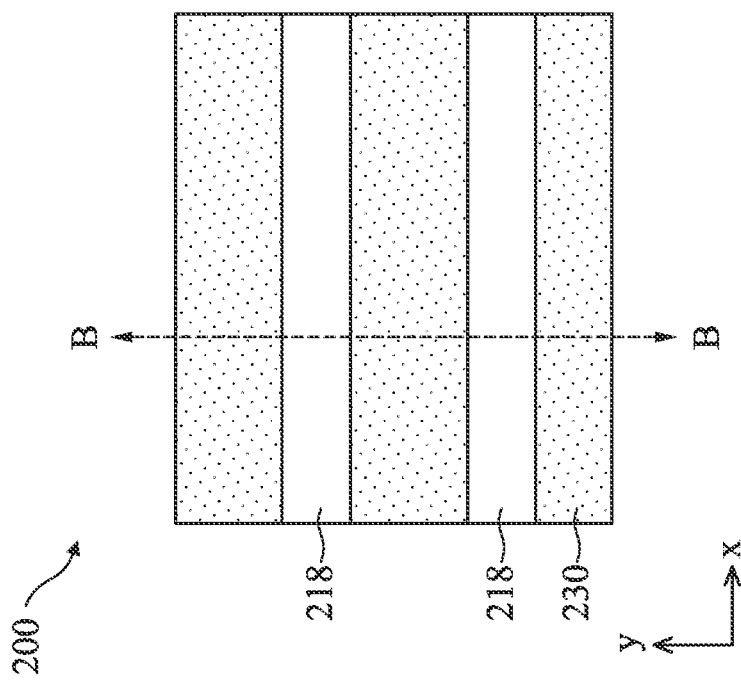

At operation 104, the method 100 (FIG. 1A) forms fins 218 by patterning the stack 205 and the substrate 201 and forms isolation features 230 adjacent to sidewalls of the fins 218. FIG. 4A illustrates a top view of the device 200 with fins 218 oriented lengthwise along the "x" direction. FIG. 4B illustrates a cross-sectional view of the device 200, in portion, along the B-B line in FIG. 4A. As illustrated in FIG. 4B, the fins 218 include the patterned stack 205 (having layers 210, 215, 210', and 215') and patterned semiconductor layer 204. The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers are formed alongside the patterned sacrificial layer using a self-aligned process. The sacrificial layer is then removed, and the remaining spacers, or mandrels, may then be used as a masking element for patterning the fins 218. For example, the masking element may be used for etching recesses into the stack 205 and the substrate 201, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 218 may be suitable.

Still referring to FIG. 4B, isolation features 230 surround a bottom portion of fins 218 to separate and isolate fins 218 from each other. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 218 with insulator material(s) (for example, by using a CVD process or a spin-on glass process), performing a chemical mechanical polishing (CMP) process to remove excessive insulator material and/or planarize a top surface of the insulator material layer, and etching back the insulator material layer to form isolation features 230. In some embodiments, isolation features 230 include a multi-layer structure, such as a silicon nitride layer disposed over a thermal oxide liner layer. In some embodiments, the device 200 may form other isolation features (or structures) such as dielectric fins (not shown) over the isolation features 230 and arranged in parallel with the fins 218. The dielectric fins may include low-k dielectric material(s), high-k dielectric material(s), or a mix of low-k and high-k dielectric materials. Low-k dielectric material generally refers to dielectric materials having a low dielectric constant, for example, lower than that of silicon oxide (k≈3.9), while high-k dielectric material generally refers to dielectric materials having a high dielectric constant, for example, higher than that of silicon oxide.

Figures 5A, 5B:
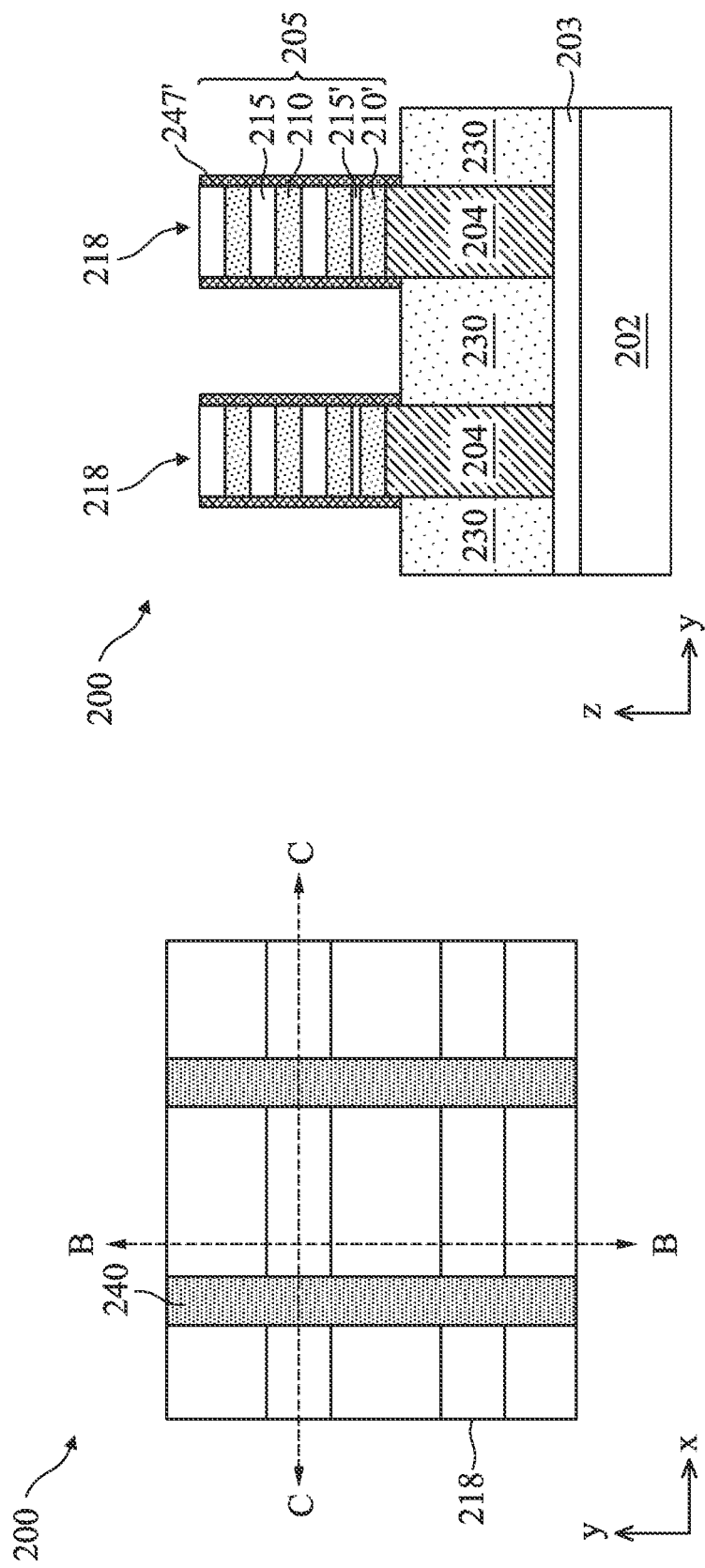
Figure 5C:
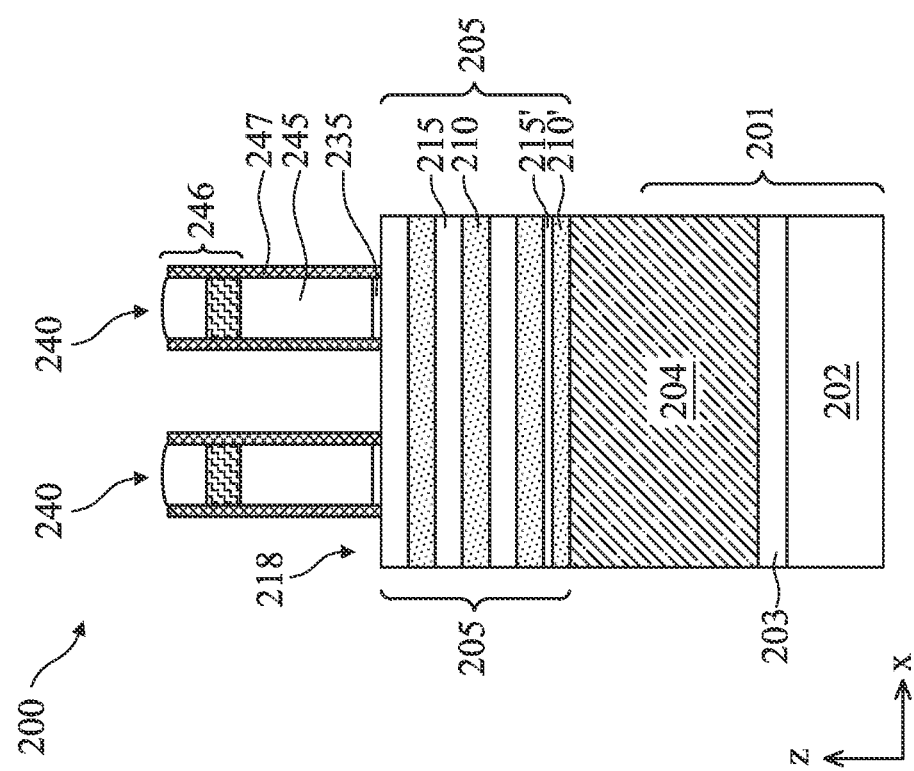

At operation 106, the method 100 (FIG. 1A) forms dummy (or sacrificial) gate stacks 240 over the fins 218 and the isolation features 230 and forms gate spacers 247 on sidewalls of the dummy gate stacks 240. The resultant structure is shown in FIGS. 5A-5C according to an embodiment. FIG. 5A illustrates a top view of the device 200, and FIGS. 5B and 5C illustrate cross-sectional views of the device 200, in portion, along the B-B line and the C-C line in FIG. 5A, respectively. The B-B line is cut into source/drain regions of the device 200. From a top view, the dummy gate stacks 240 are oriented lengthwise generally along the "y" direction perpendicular to the "x" direction. Dummy gate stacks 240 are formed by deposition processes, lithography processes, etching processes, other suitable processes, or combinations thereof. For example, deposition processes are performed to form a dummy gate dielectric layer 235 and a dummy gate electrode layer 245 over the dummy gate dielectric layer 235. In some embodiment, one or more hard mask layers 246 are deposited over the dummy gate electrode layer 245. The dummy gate dielectric layer 235 may include a dielectric material, such as silicon oxide, a high-k dielectric material, other suitable dielectric material. In some embodiments, the dummy gate electrode layer 245 includes polysilicon or other suitable material and the one or more hard mask layers 246 include silicon oxide, silicon nitride, or other suitable materials. The deposition process may include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. A lithography patterning and etching process is then performed to pattern the one or more hard mask layers 246, the dummy gate electrode layer 245, and the dummy gate dielectric layer 235 to form dummy gate stacks 240, as depicted in FIG. 5C. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

In the present embodiment, gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 240. In the present embodiment, the process of forming the gate spacers 247 also forms fin sidewall spacers 247', and the fin sidewall spacers 247' comprise the same material as the gate spacers 247. A height of the fin sidewall spacers 247' may be used for tuning a size and shape of source/drain features. In some embodiments, the fin sidewall spacers 247' are omitted or removed from the device 200.

Figure 6C:
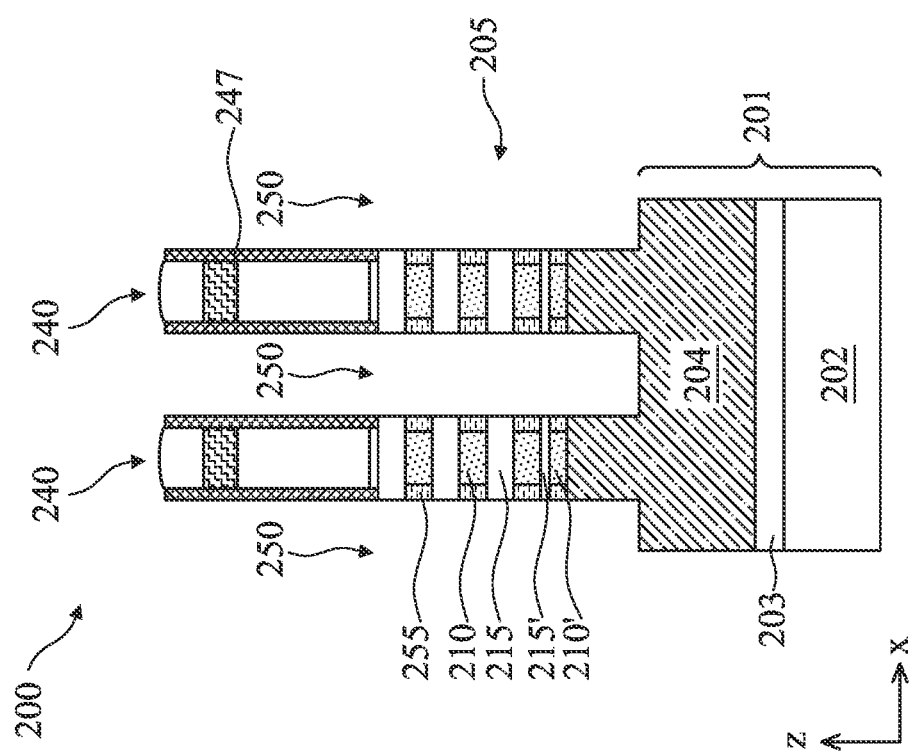

At operation 108, the method 100 (FIG. 1A) forms source/drain (S/D) trenches 250 by etching the fins 218 adjacent the gate spacers 247 and then form inner spacers 255. The resultant structure is shown in FIGS. 6A-6C according to an embodiment. FIG. 6A illustrates a top view of the device 200, and FIGS. 6B and 6C illustrate cross-sectional views of the device 200, in portion, along the B-B line and the C-C line in FIG. 6A, respectively. Particularly, the B-B line is cut into the source/drain regions of the transistors and is parallel to the gate stacks 240. The B-B lines in FIGS. 7A through 8A are similarly configured. In an embodiment, an etching process completely removes semiconductor layer stack 205 in source/drain regions of fins 218 thereby exposing the substrate portion 204 of fins 218 in the source/drain regions. In some embodiments, the etching process further removes some, but not all, of the substrate portion of fins 218, such that source/drain trenches 250 extend below a topmost surface of substrate 201. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210/210' and semiconductor layers 215/215'. In some embodiments, parameters of the etching process are configured to selectively etch semiconductor layer stack with minimal (to no) etching of gate stacks 240 and/or isolation features 230. In some embodiments, a lithography process, such as those described herein, is performed to form a patterned mask layer that covers gate stacks 240 and/or isolation features 230, and the etching process uses the patterned mask layer as an etch mask. In an embodiment, the fin sidewall spacers 247' (if present) may be recessed as well, as illustrated in FIG. 6B.

The operation 108 further forms inner spacers 255 (see FIG. 6C) along sidewalls of semiconductor layers 210/210' inside the S/D trenches 250. For example, a first etching process is performed that selectively etches semiconductor layers 210/210' exposed by source/drain trenches 250 with minimal (to no) etching of semiconductor layers 215/215', such that gaps are formed between semiconductor layers 215/215' and between semiconductor layer 215' and semiconductor layer 204 under gate spacers 247. Portions (edges) of semiconductor layers 215/215' are thus suspended in the channel regions under gate spacers 247. In some embodiments, the gaps extend partially under dummy gate stacks 240. The first etching process is configured to laterally etch (e.g., along the "x" direction) semiconductor layers 210 and 210', thereby reducing a length of semiconductor layers 210 and 210' along the "x" direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215/215', 210/210', and 204), such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 250. The deposition process is configured to ensure that the spacer layer fills the gaps between semiconductor layers 215/215' and between semiconductor layer 215' and semiconductor layer 204 under gate spacers 247. A second etching process is then performed that selectively etches the spacer layer to form inner spacers 255 as depicted in FIG. 6C with minimal (to no) etching of semiconductor layers 215/215', dummy gate stacks 240, and gate spacers 247. In some embodiments, the spacer layer is removed from sidewalls of gate spacers 247, sidewalls of semiconductor layers 215/215', dummy gate stacks 240, and semiconductor layer 204. The spacer layer (and thus inner spacers 255) includes a material that is different than a material of semiconductor layers 215/215'/204 and a material of gate spacers 247 to achieve desired etching selectivity during the second etching process. In some embodiments, the spacer layer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer 255 includes a low-k dielectric material, such as those described herein.

Figure 7C:
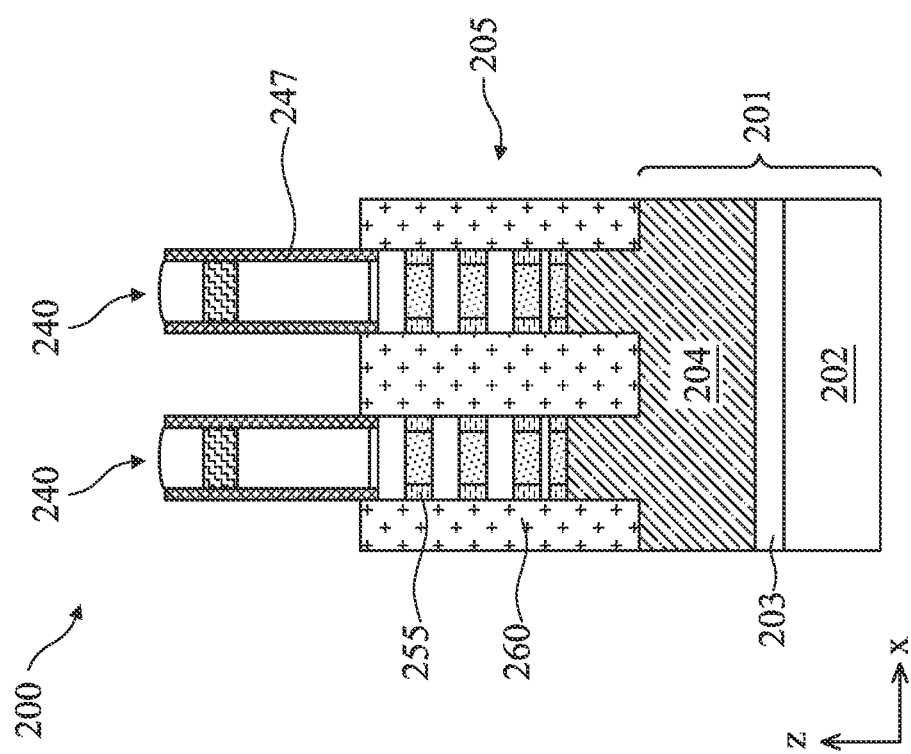

At operation 110, the method 100 (FIG. 1A) epitaxially grows semiconductor S/D features 260 in the S/D trenches 250. The resultant structure is shown in FIGS. 7A-7C according to an embodiment. FIG. 7A illustrates a top view of the device 200, and FIGS. 7B and 7C illustrate cross-sectional views of the device 200, in portion, along the B-B line and the C-C line in FIG. 7A, respectively. As shown in FIGS. 7B and 7C, epitaxial S/D features 260 are grown from the semiconductor layer 204 at the bottom of the S/D trenches 250 and from the semiconductor layers 215 and 215' at the sidewalls of the S/D trenches 250. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 204, 215, and 215'. Epitaxial S/D features 260 are doped with n-type dopants or p-type dopants for n-type transistors or p-type transistors respectively. In some embodiments, for n-type transistors, epitaxial S/D features 260 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260 include silicon germanium or germanium and can be doped with boron, other p-type dopant, or combinations thereof (for example, forming Si:Ge:B epitaxial source/drain features). In some embodiments, epitaxial S/D features 260 include more than one epitaxial semiconductor layer, where the epitaxial semiconductor layers can include the same or different materials and/or dopant concentrations. In some embodiments, epitaxial S/D features 260 include materials and/or dopants that achieve desired tensile stress and/or compressive stress in respective channel regions. In some embodiments, epitaxial source/drain features 260 are doped during deposition by adding impurities to a source material of the epitaxy process (i.e., in-situ). In some embodiments, epitaxial source/drain features 260 are doped by an ion implantation process subsequent to a deposition process. In some embodiments, annealing processes (e.g., rapid thermal annealing (RTA) and/or laser annealing) are performed to activate dopants in epitaxial source/drain features 260. In some embodiments, epitaxial source/drain features 260 are formed in separate processing sequences that include, for example, masking p-type GAA transistor regions when forming epitaxial source/drain features 260 in n-type GAA transistor regions and masking n-type GAA transistor regions when forming epitaxial source/drain features 260 in p-type GAA transistor regions.

Figure 8B:
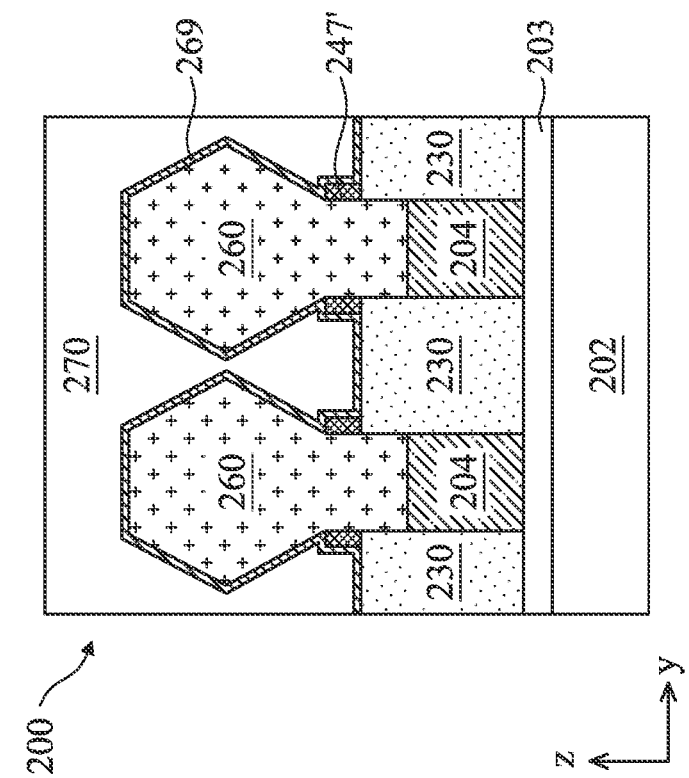
Figure 8A:
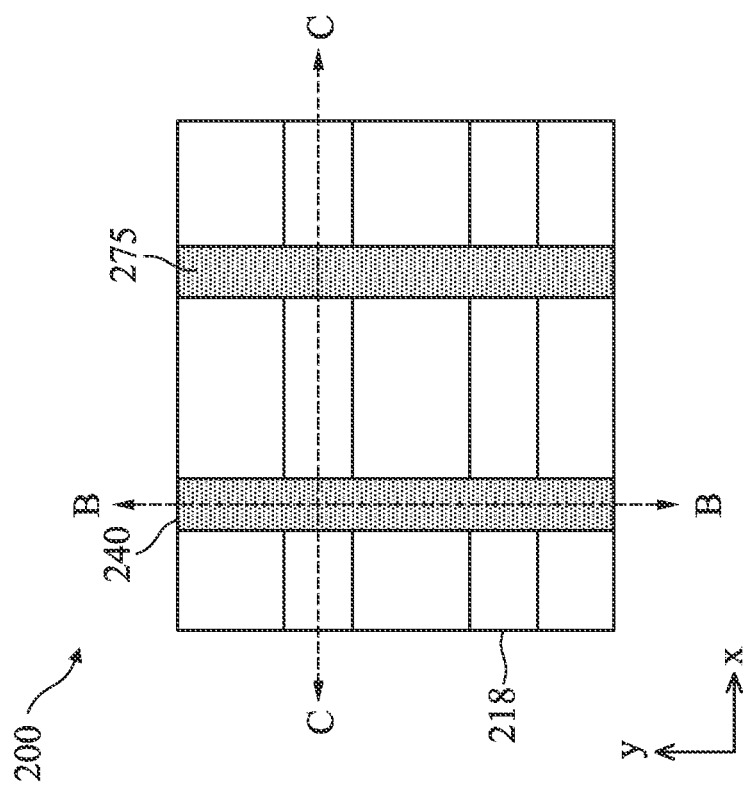
Figure 8C:
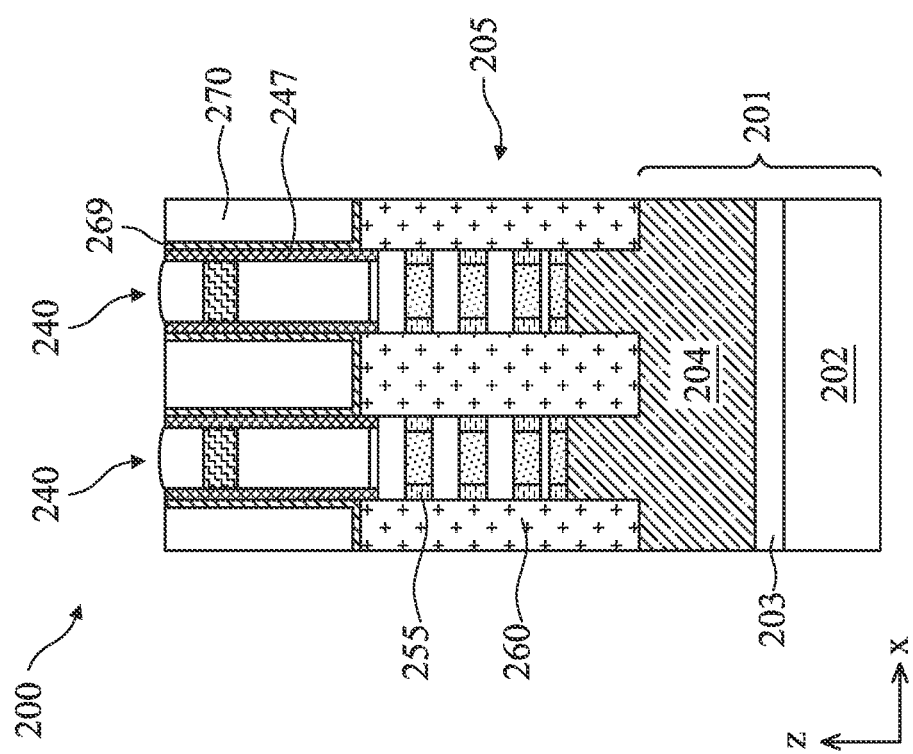

At operation 112, the method 100 (FIG. 1A) forms a contact etch stop layer (CESL) 269 and an inter-layer dielectric (ILD) layer 270. The resultant structure is shown in FIGS. 8A-8C according to an embodiment. FIG. 8A illustrates a top view of the device 200, and FIGS. 8B and 8C illustrate cross-sectional views of the device 200, in portion, along the B-B line and the C-C line in FIG. 8A, respectively. The CESL 269 is deposited over the S/D features 260, the isolation features 230, and the fin sidewall spacers 247' (if present). The ILD layer 270 is deposited over the CESL 269 and fills the space between opposing gate spacers 247 and between the S/D features 260. The CESL 269 includes a material that is different than ILD layer 270. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, a chemical mechanical planarization (CMP) process and/or other planarization process is performed until reaching a top portion of dummy gate stacks 240. In some embodiments, the planarization process removes hard mask layers 246 of dummy gate stacks 240 to expose underlying dummy gate electrodes 245, such as polysilicon gate electrode layers.

Figures 9A, 9B:
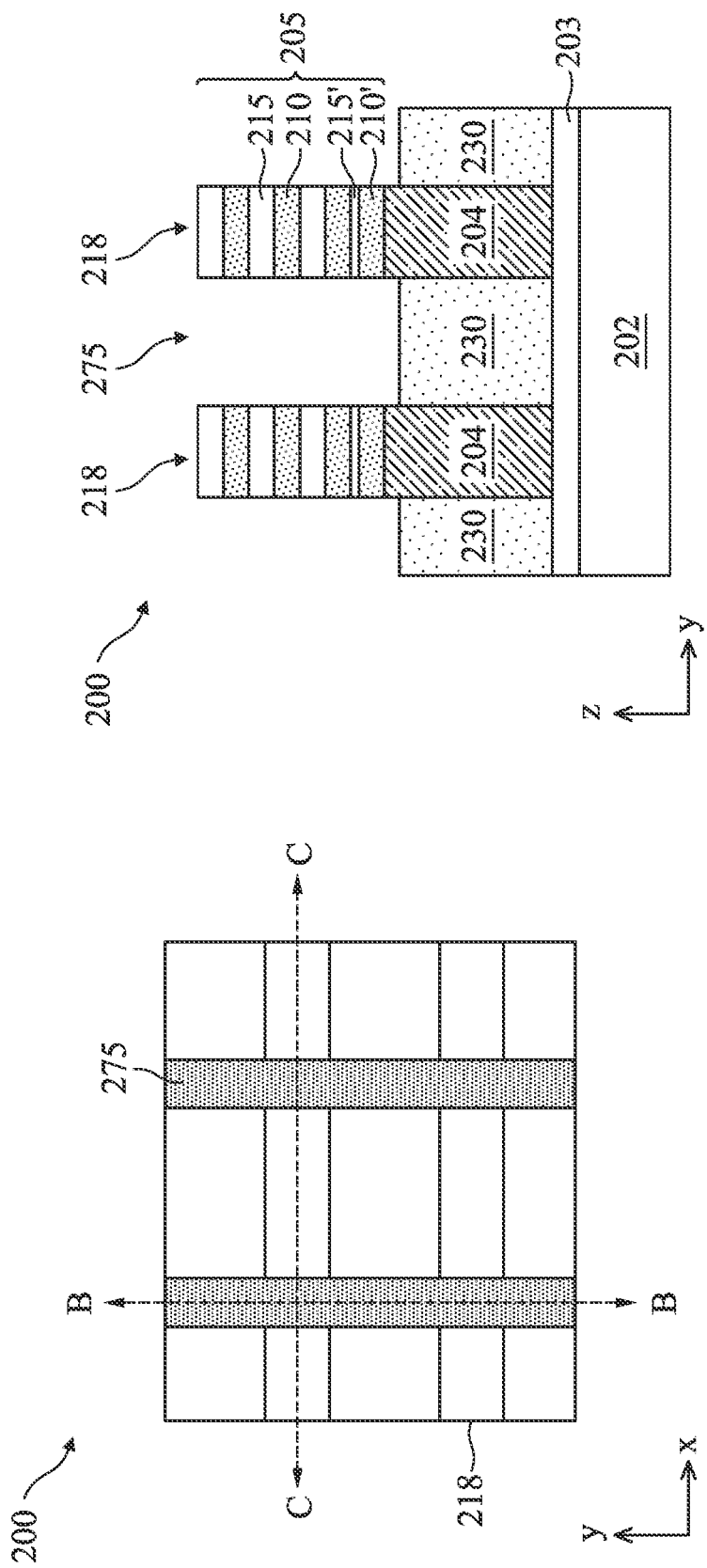
Figure 9C:
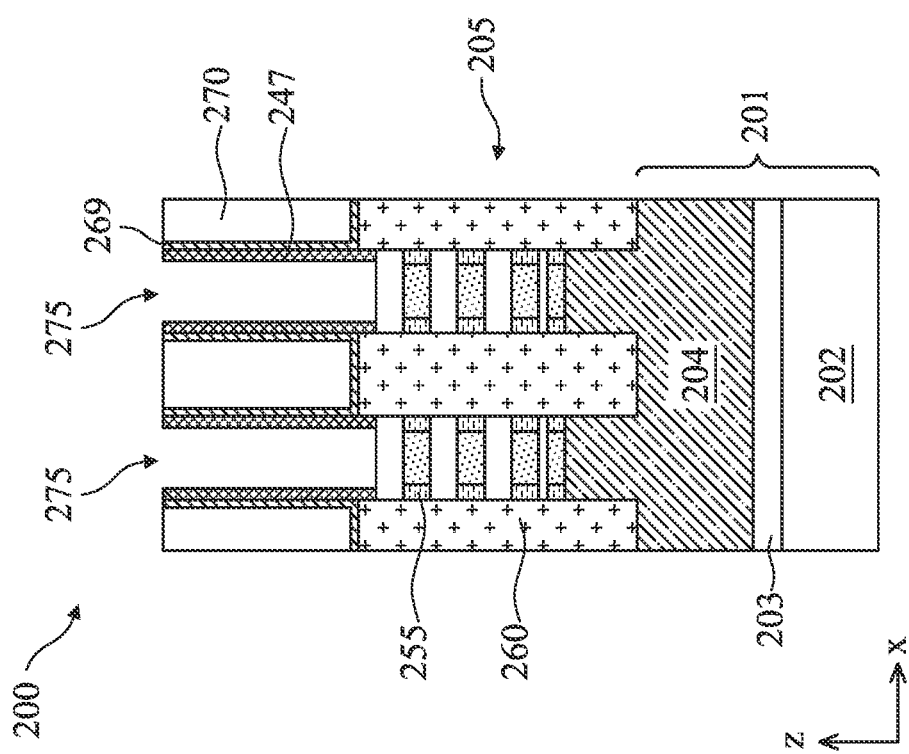

At operation 114, the method 100 (FIG. 1A) removes the dummy gate stacks 240 to form gate trenches 275. The resultant structure is shown in FIGS. 9A-9C according to an embodiment. FIG. 9A illustrates a top view of the device 200, and FIGS. 9B and 9C illustrate cross-sectional views of the device 200, in portion, along the B-B line and the C-C line in FIG. 9A, respectively. Particularly, the B-B line in FIG. 9A cuts into the device 200 in the channel region (or gate region). The operation 114 may use one or more dry etching processes, wet etching processes, other suitable etching processes, or combinations thereof. In some embodiments, the etching process is a multi-step etch process. For example, the etching process may alternate etchants to separately remove various layers of dummy gate stacks 240. In some embodiments, the etching process is configured to selectively etch dummy gate stacks 240 with minimal (to no) etching of other features of the device 200, such as ILD layer 270, gate spacers 247, isolation features 230, semiconductor layers 215 and 215', and semiconductor layers 210 and 210'. As a result, the semiconductor layers 215 and 215', the semiconductor layers 210 and 210', the inner spacers 255, the semiconductor layer 204, and the isolation features 230 are exposed in the gate trenches 275.

Figure 10C:
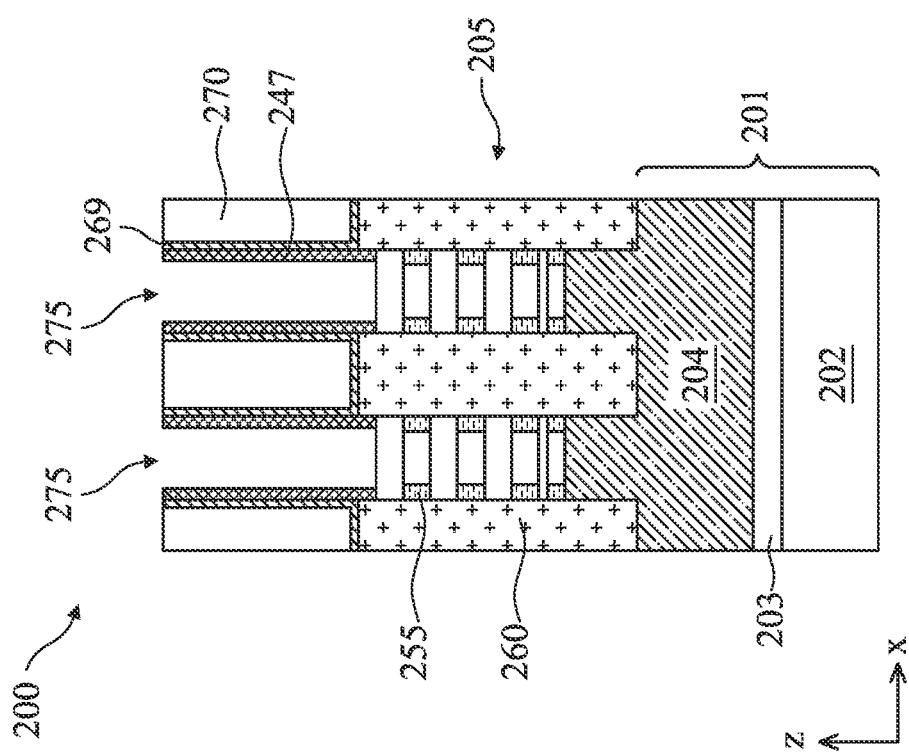

At operation 116, the method 100 (FIG. 1A) removes the semiconductor layers 210 and 210' exposed in the gate trenches 275, leaving the semiconductor layers 215 and 215' suspended over the semiconductor layer 204 and connected with the S/D features 260. The resultant structure is shown in FIGS. 10A-10C according to an embodiment. FIG. 10A illustrates a top view of the device 200, and FIGS. 10B and 10C illustrate cross-sectional views of the device 200, in portion, along the B-B line and the C-C line in FIG. 10A, respectively. Particularly, the B-B line in FIG. 10A cuts into the device 200 in the channel region (or gate region). This process is also referred to as a channel release process and the semiconductor layers 215 and 215' are also referred to as channel layers. The etching process selectively etches semiconductor layers 210 and 210' with minimal (to no) etching of semiconductor layers 215 and 215' and, in some embodiments, minimal (to no) etching of gate spacers 247 and/or inner spacers 255.

Figure 11:
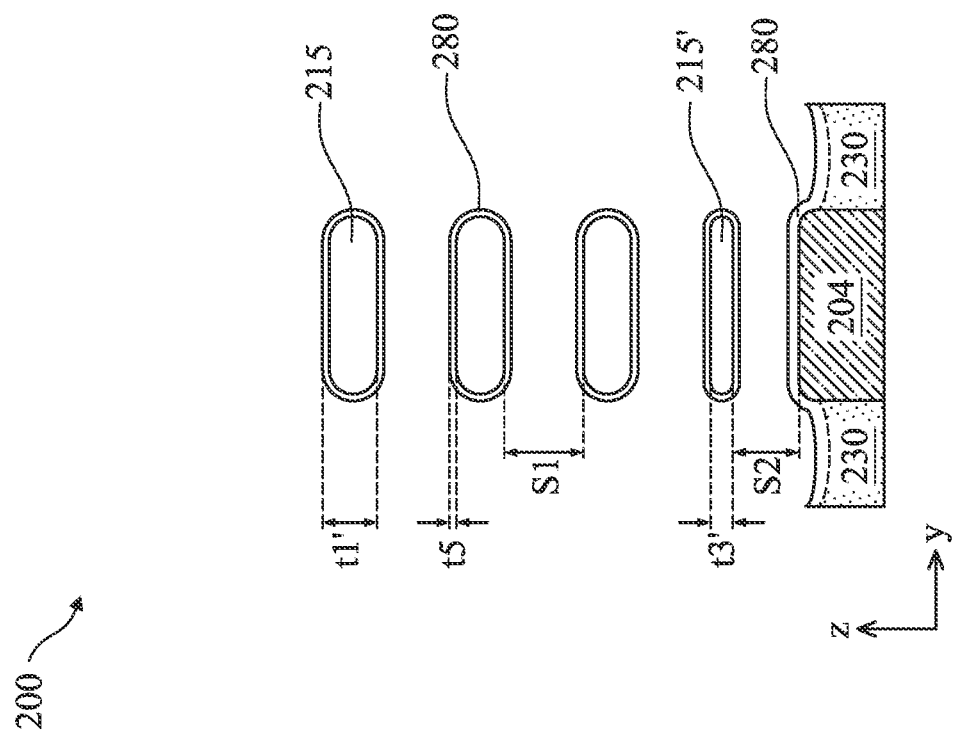

At operation 118, the method 100 (FIG. 1A) forms an interfacial layer 280 over the surfaces of the semiconductor layers 215 and 215' that are exposed in the gate trenches 275. The resultant structure is shown in FIG. 11 according to an embodiment. FIG. 11 illustrates a cross-sectional view of the device 200, in portion, along the B-B line in FIG. 10A. For purpose of simplicity, not all features of the device 200 are shown in FIG. 11. In some embodiments, the interfacial layer 280 is formed by an oxidation process such as thermal oxidation or chemical oxidation by oxidizing surfaces of the semiconductor layers 215, 215', and 204 that are exposed in the gate trenches 275. In those embodiments, the interfacial layer 280 is not formed over the surfaces of the isolation features 230. In some embodiments, the interfacial layer 280 is formed by a deposition process such as ALD or CVD over surfaces of the semiconductor layers 215, 215', and 204 and the isolation features 230 that are exposed in the gate trenches 275, such as depicted in FIG. 11. The interfacial layer 280 may include silicon dioxide, silicon oxynitride, or other suitable materials. The interfacial layer 280 is formed to a thickness t5. In the present embodiment, t5 is less than half of S2. For example, t5 may be about 0.5 nm to about 1 nm in some embodiments. FIG. 11 also illustrates various dimensions of the device 200 at this fabrication stage. The thicknesses t1' and t3' of the semiconductors 215 and 215', respectively, may be substantially the same as the thicknesses t1 and t3 discussed with reference to FIG. 3, with differences between t1 and t1' and between t3 and t3' caused by the channel release process and the oxidation process if that is used for forming the interfacial layer 280. In some embodiments, the thickness t1' may be in a range of about 4 nm to about 6 nm, the thicknesses t3' may be in a range of about 1 nm to about 4 nm, while it is maintained that t3' is smaller than t1'. In some embodiments, a ratio of t3' to t1' is in a range of about 0.33 to about 1.0 and less than 1.0. These disclosed ranges are designed to reduce leakage current (from sub-channel effects) through the semiconductor layer 215' and to improve channel uniformity among the channel layers 215, as discussed above with reference to FIG. 3. The vertical spacing S1 between adjacent layers 215 and between layer 215 and layer 215' is about the same as the thickness t2 (FIG. 3) and the vertical spacing S2 between layer 215' and layer 204 is about the same as the thickness t4 (FIG. 3), with differences between S1 and t2 and between S2 and t4 caused by the channel release process and the oxidation process if that is used for forming the interfacial layer 280. In some embodiment, S1 is greater than S2 by about 3 nm to about 6 nm. In some embodiments, S2 is about 2 nm to about 5 nm, while S1 is greater than S2 by about 3 nm to about 6 nm. In some embodiments, a ratio of S2 to S1 is designed to be in a range of about 0.33 to about 0.6. The importance of these dimension and ratio ranges for S2 and S1 is the same as that discussed above for thicknesses t4 and t2 in FIG. 3. For example, if the ratio of S2 to S1 is too small (such as less than 0.33) or too large (such as more than 0.6) or if S2 is too small (less than 2 nm) or too large (more than 5 nm), it might be difficult to fully fill the space between the layers 215' and 204 with dielectric material(s) or the dielectric materials therein might not provide sufficient isolation for TDDB performance purposes.

Figure 12A:
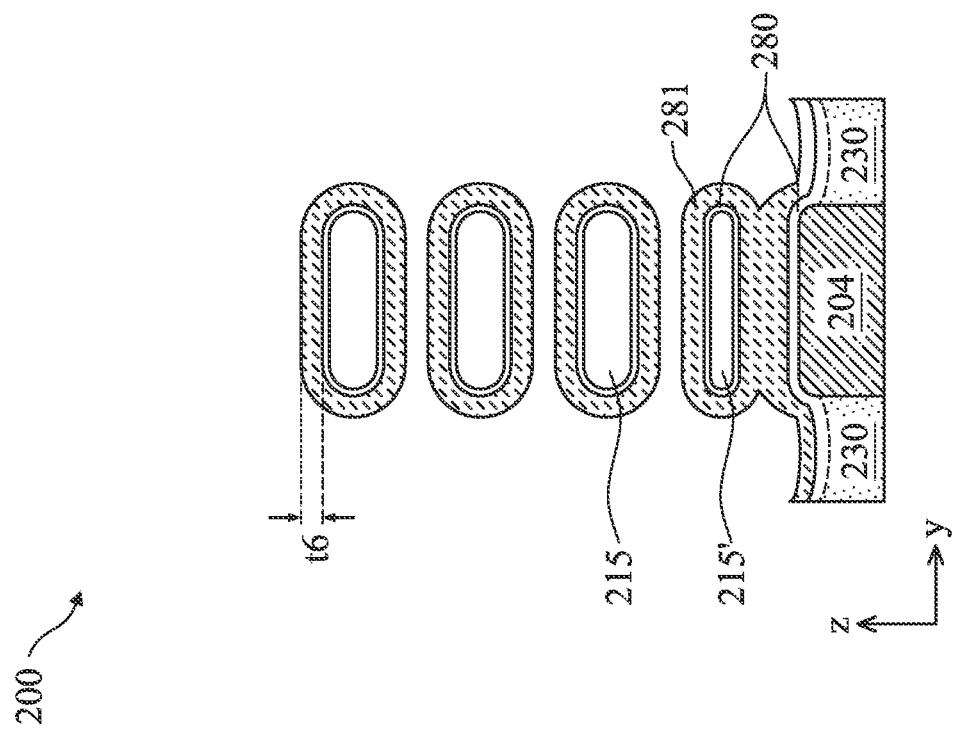
Figure 12C:
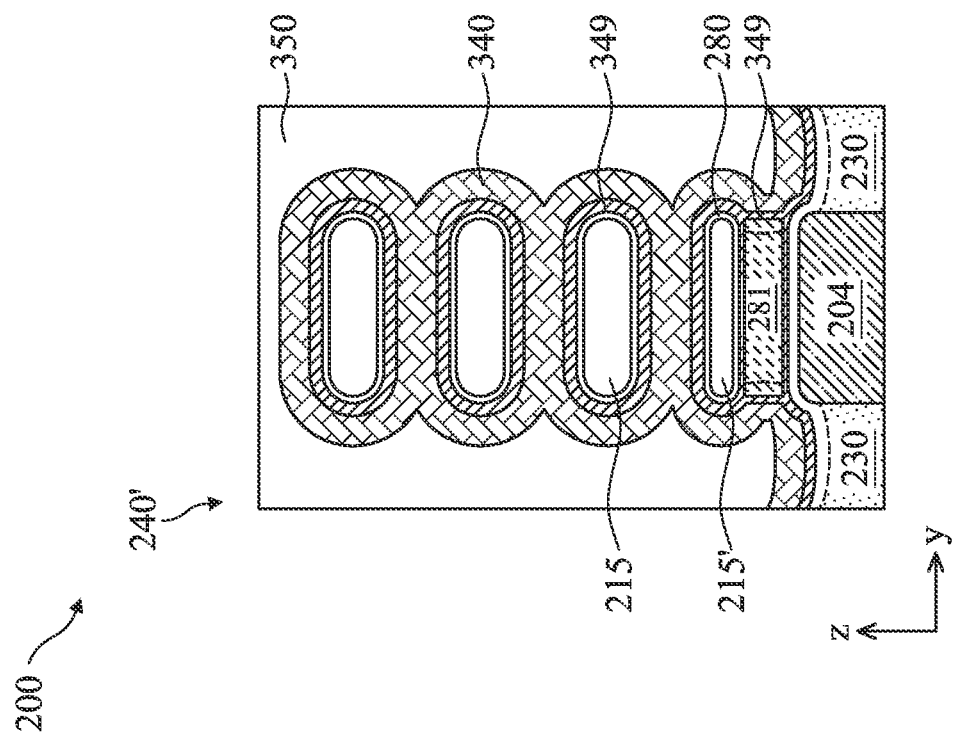
Figure 12B:
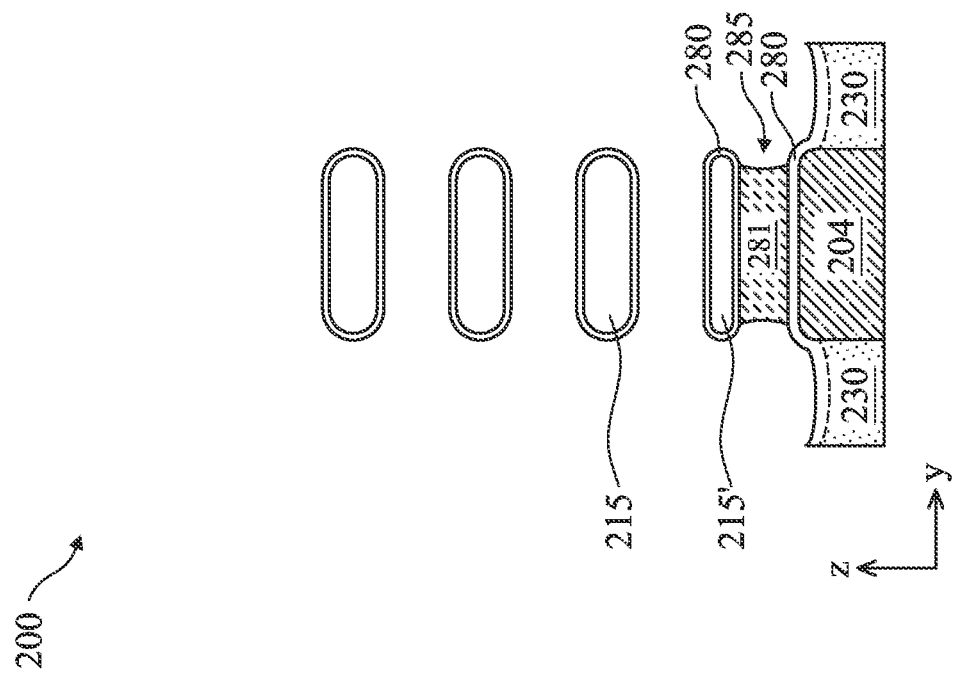

Next, the method 100 proceeds to forming one or more dielectric materials to fully fill the space between the layer 215' and the layer 204 and then form a high-k metal gate 240' over the channel layers 215 and 215'. FIGS. 1B and 1C illustrate two alternative embodiments of the method 100 for the above purposes. FIGS. 12A, 12B, and 12C illustrate cross-sectional views of the device 200, in portion, along the B-B line in FIG. 10A, according to the method 100 in FIG. 1B. FIGS. 13A, 13B, 13C, and 13D illustrate cross-sectional views of the device 200, in portion, along the B-B line in FIG. 10A, according to the method 100 in FIG. 1C. FIGS. 1B and 1C are separately discussed below.

Referring to FIG. 1B, the method 100 proceeds from the operation 118 to operation 120 to form a high-k dielectric layer 281 over the interfacial layer 280. A resultant structure of the device 200 is shown in FIG. 12A. In the present embodiment, the high-k dielectric layer 281 surrounds the interfacial layer 280 that in turn surrounds the semiconductor layers 215 and 215'. The high-k dielectric layer 281 is also disposed over the interfacial layer 280 that is over the semiconductor layer 204 and the isolation features 230. The dielectric layer 281 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, $BaZrO$, $BaTiO_3$. (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The dielectric layer 281 may be formed by chemical oxidation, thermal oxidation, ALD, CVD, and/or other suitable methods. The dielectric layer 281 is formed to a thickness t6. In the present embodiment, the thickness t6 is controlled such that t6 is less than half of (S1−2*t5) but greater than or equal to half of (S2—2*t5). When the thickness t6 is controlled to be in such range, the dielectric layer 281 disposed on the bottom surface of the layer 215' and on the top surface of the layer 204 merge into one dielectric layer and filling the space between the layers 215' and 204, while the dielectric layer 281 disposed over the semiconductor layers 215 do not merge with each other and the dielectric layer 281 disposed over the semiconductor layers 215 and 215' do not merge with each other.

Referring to FIG. 1B, at operation 122, the method 100 etches the dielectric layer 281 so that only the merged portion of the dielectric layer 281 between the layers 215' and 204 remains in the device 200 while the rest of the dielectric layer 281 is removed. Referring to FIG. 12B, the dielectric layer 281 is removed from the area surrounding the semiconductor layers 215, above the semiconductor layer 215', and above the isolation features 230. In an embodiment, operation 122 applies an isotropic etching process to the dielectric layer 281. Further, the isotropic etching process is tuned selective to the material(s) in the dielectric layer 281 with no (or minimal) etching to the interfacial layer 280, the isolation features 230, the semiconductor layers 215, 215', and 204, as well as other features exposed in the gate trenches 275 including the inner spacers 255 and the gate spacers 247 (FIGS. 10B and 10C). The isotropic etching process may use an etchant such as SPM cleaning solution (a mixture of $H_2SO_4$ and $H_2O_2$ with a ratio of $H_2SO_4$:$H_2O_2$ of 1:4 for example), diluted hydro fluoride acid (dHF, a mixture of hydro fluoride and water), or other suitable etchant(s). The etchant is applied into the space between adjacent semiconductor layers 215/215' and to completely remove the dielectric layer 281 from the area surrounding the semiconductor layers 215 and above the semiconductor layer 215'. The etchant also laterally recesses the dielectric layer 281 between the semiconductor layers 215' and 204, but a substantial portion of the dielectric layer 281 remains between the semiconductor layers 215' and 204. As a result, a substantial portion of the space between the semiconductor layers 215' and 204 remains filled by a dielectric feature 285 that includes the dielectric layer 281 sandwiched by the interfacial layer 280. Further, the dielectric feature 285 is (center) aligned with the layer 215' and the semiconductor fin 204. Thus, the dielectric feature 285 is a self-aligned dielectric capping layer. In some embodiments, other portions of the interfacial layer 280 may be partially or completely consumed by the isotropic etching process.

Referring to FIG. 1B, at operation 124, the method 100 repairs the interfacial layer 280. For example, operation 124 may perform a cleaning process, a thermal process, a deposition process, or other suitable processes to re-form the interfacial layer 280 or to add thickness to the interfacial layer 280. In some embodiments of the method 100, the operation 124 is optional and may be skipped or omitted.

Referring to FIG. 1B, at operation 126, the method 100 forms a high-k metal gate 240' engaging the channel layers 215 and 215', such as shown in FIG. 12C according to an embodiment. For example, the operation 126 forms a high-k dielectric layer 349 over the interfacial layer 280 and the high-k dielectric layer 281, forms one or more work function metal layers 340 over the high-k dielectric layer 349, and forms a gate electrode 350 over the work function metal layers 340. In some embodiments, the interfacial layer 280 is considered part of the high-k metal gate 240'. The high-k dielectric layer 349 may include a material that is the same as or different from the material in the high-k dielectric layer 281. The high-k dielectric layer 349 may include $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The high-k dielectric layer 349 may be formed by chemical oxidation, thermal oxidation, atomic layer deposition (ALD), chemical vapor deposition (CVD), and/or other suitable methods. The work function metal layer 340 may be an n-type or a p-type work function layer, depending on the type of the GAA transistor. An n-type work function layer may comprise a metal with sufficiently low effective work function such as titanium, aluminum, tantalum carbide, tantalum carbide nitride, tantalum silicon nitride, or combinations thereof. A p-type work function layer may comprise a metal with a sufficiently large effective work function, such as titanium nitride, tantalum nitride, ruthenium, molybdenum, tungsten, platinum, or combinations thereof. The gate electrode layer 350 may include aluminum, tungsten, cobalt, copper, and/or other suitable materials. The gate electrode layer 350 may be formed by CVD, PVD, plating, and/or other suitable processes. After the semiconductor layer 204 (or a portion thereof) is replaced with a backside via as will be discussed, the dielectric layers 280, 281, and 349 collectively isolate the backside via from the metal gate 240'.

Figure 13B:
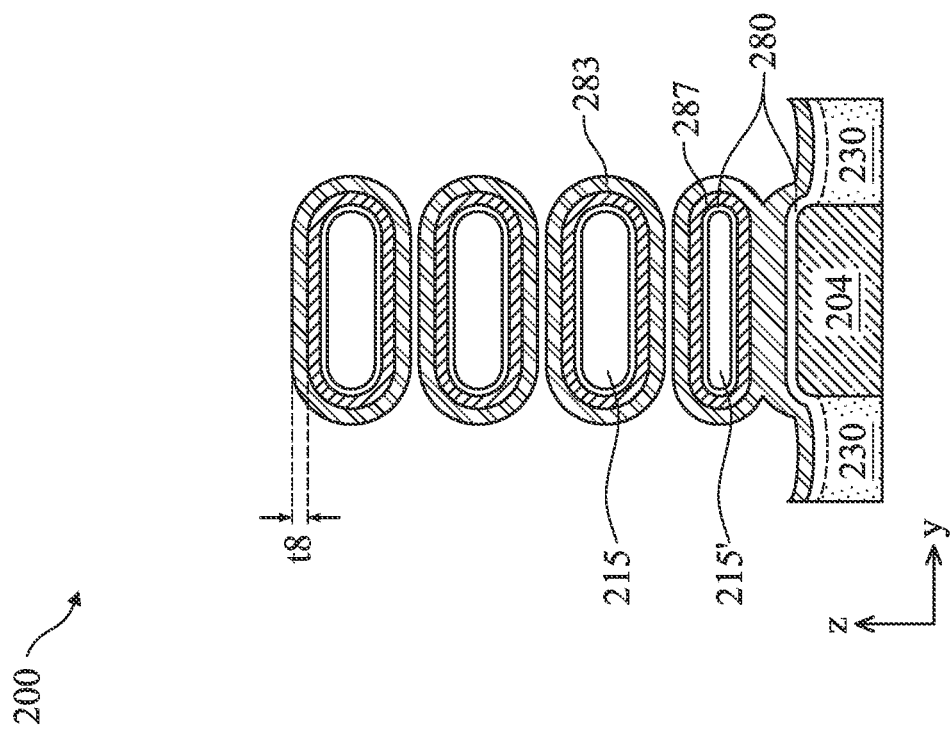
Figure 13A:
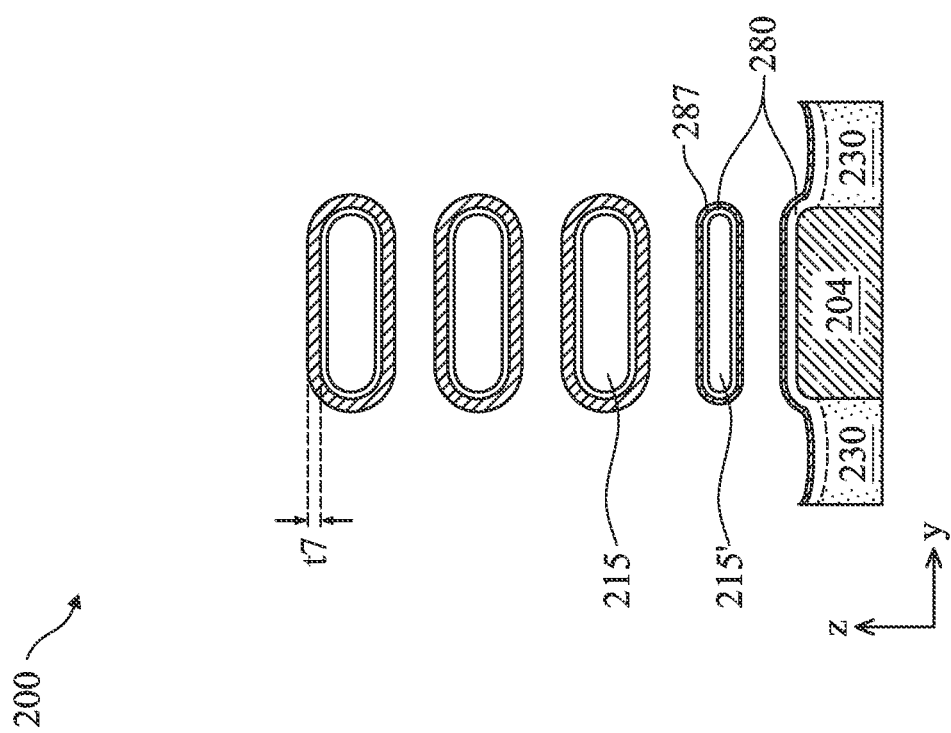

Referring to FIG. 1C (an alternative embodiment to FIG. 1B), the method 100 proceeds from the operation 118 to operation 121 to form a high-k dielectric layer 287 over the interfacial layer 280. A resultant structure of the device 200 is shown in FIG. 13A. In the present embodiment, the high-k dielectric layer 287 surrounds the interfacial layer 280 that in turn surrounds the semiconductor layers 215 and 215'. The high-k dielectric layer 287 is also disposed over the interfacial layer 280 that is over the semiconductor layer 204 and the isolation features 230. The dielectric layer 287 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The dielectric layer 287 may be formed by chemical oxidation, thermal oxidation, ALD, CVD, and/or other suitable methods. The dielectric layer 287 is formed to a thickness t7. In the present embodiment, the thickness t7 is controlled to be less than half of (S2−2*t5) so that the dielectric layer 287 does not fill the space between the layers 215' and 204 and does not fill the space between the layers 215 and 215'. In some embodiments, t7 may be in a range of about 0.8 nm to about 1.2 nm.

Referring to FIG. 1C, at operation 123, the method 100 forms a low-k dielectric layer 283 over the high-k dielectric layer 287. A resultant structure of the device 200 is shown in FIG. 13B. In the present embodiment, the low-k dielectric layer 283 surrounds the high-k dielectric layer 287. The low-k dielectric layer 283 is also disposed over the high-k dielectric layer 287 that is over the semiconductor layer 204 and the isolation features 230. The low-k dielectric layer 283 may include a low-k dielectric material such as a dielectric material including Si, O, N, and C (for example, SiOCN, SiOC, SiCN, $SiO_2$, $Si_3N_4$, or a combination thereof), other suitable low-k dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, or combinations thereof. The low-k dielectric layer 283 may be formed by chemical oxidation, thermal oxidation, ALD, CVD, and/or other suitable methods. The dielectric layer 283 is formed to a thickness t8. In the present embodiment, the thickness t8 is controlled such that t8 is less than half of (S1−2*t5−2*t7) but greater than or equal to half of (S2−2*t5−2*t7). When the thickness t8 is controlled to be in such range, the dielectric layer 283 disposed on the bottom surface of the layer 215' and on the top surface of the layer 204 merge into one dielectric layer and filling the space between the layers 215' and 204, while the dielectric layer 283 disposed over the semiconductor layers 215 does not merge with each other and the dielectric layer 283 disposed over the semiconductor layers 215 and 215' does not merge with each other.

Referring to FIG. 1C, at operation 125, the method 100 etches the dielectric layer 283 so that only the merged portion of the dielectric layer 283 between the layers 215' and 204 remains in the device 200 while the rest of the dielectric layer 283 is removed. Referring to FIG. 13C, the dielectric layer 283 is removed from the area surrounding the semiconductor layers 215, above the semiconductor layer 215', and above the isolation features 230. In an embodiment, operation 125 applies an isotropic etching process to the dielectric layer 283. Further, the isotropic etching process is tuned selective to the material(s) in the dielectric layer 283 with no (or minimal) etching to the high-k dielectric layer 287 and other features exposed in the gate trenches 275 including the inner spacers 255 and the gate spacers 247 (FIGS. 10B and 10C). The isotropic etching process may use a dry etching method or a wet etching method. For example, the isotropic etching process may use an etchant such as SPM (a mixture of $H_2SO_4$ and $H_2O_2$), DHF (a mixture of HF and $H_2O$), $BCl_3$, HBr, chlorine, or other suitable etchant(s). The etchant is applied into the space between adjacent semiconductor layers 215/215' and to completely remove the dielectric layer 283 from the area surrounding the semiconductor layers 215 and above the semiconductor layer 215'. The etchant also laterally recesses the dielectric layer 283 between the semiconductor layers 215' and 204, but a substantial portion of the dielectric layer 283 remains between the semiconductor layers 215' and 204. As a result, a substantial portion of the space between the semiconductor layers 215' and 204 remains filled by a dielectric feature 289 that includes the dielectric layer 283 sandwiched by the high-k dielectric layer 287 and the interfacial layer 280. Further, the dielectric feature 289 is (center) aligned with the layer 215' and the semiconductor fin 204. Thus, the dielectric feature 289 is a self-aligned dielectric capping layer. In the present embodiment, the high-k dielectric layer 287 protects the interfacial layer 280 from the isotropic etching process.

Figure 13D:
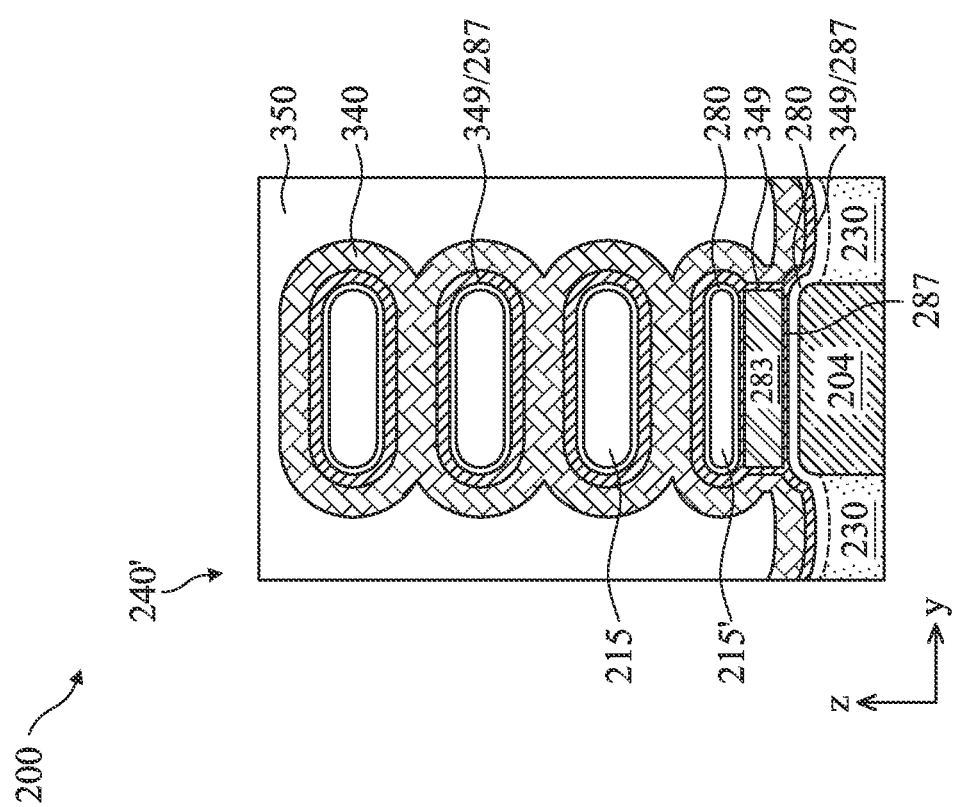
Figure 13C:
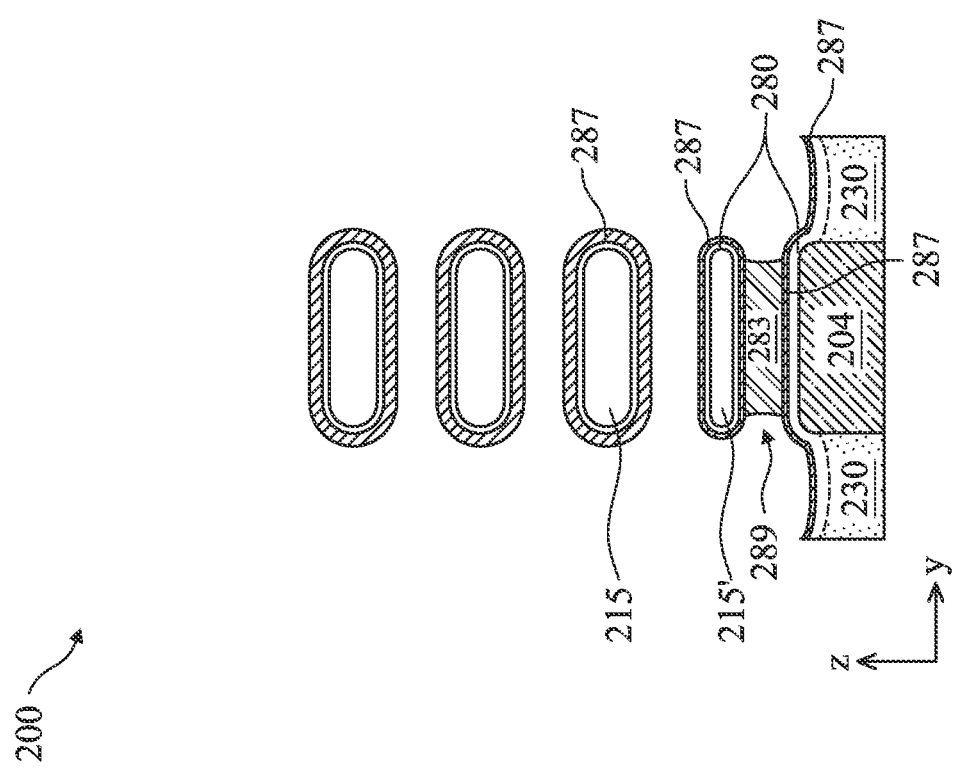

Referring to FIG. 1C, at operation 127, the method 100 forms a high-k metal gate 240' engaging the channel layers 215 and 215', such as shown in FIG. 13D according to an embodiment. For example, the operation 127 forms a high-k dielectric layer 349 over the high-k dielectric layer 287 and the low-k dielectric layer 283, forms one or more work function metal layers 340 over the high-k dielectric layer 349, and forms a gate electrode 350 over the work function metal layers 340. In some embodiments, the interfacial layer 280 is considered part of the high-k metal gate 240'. The high-k dielectric layer 349 may include a material that is the same as or different from the material in the high-k dielectric layer 287. The high-k dielectric layer 349 may include $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The high-k dielectric layer 349 may be formed by chemical oxidation, thermal oxidation, atomic layer deposition (ALD), chemical vapor deposition (CVD), and/or other suitable methods. The work function metal layer 340 may be an n-type or a p-type work function layer, depending on the type of the GAA transistor. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. The gate electrode layer 350 may include aluminum, tungsten, cobalt, copper, and/or other suitable materials. The gate electrode layer 350 may be formed by CVD, PVD, plating, and/or other suitable processes. As shown in FIG. 13D, the low-k dielectric layer 283 is surrounded (or sealed off) by the high-k dielectric layers 287 and 349. After the semiconductor layer 204 (or a portion thereof) is replaced with a backside via as will be discussed, the low-k dielectric layer 283 functions to reduce the coupling capacitance between the backside via and the metal gate 240', while the dielectric layers 280, 283, 287, and 349 collectively isolate the backside via from the metal gate 240'.

Figure 14:
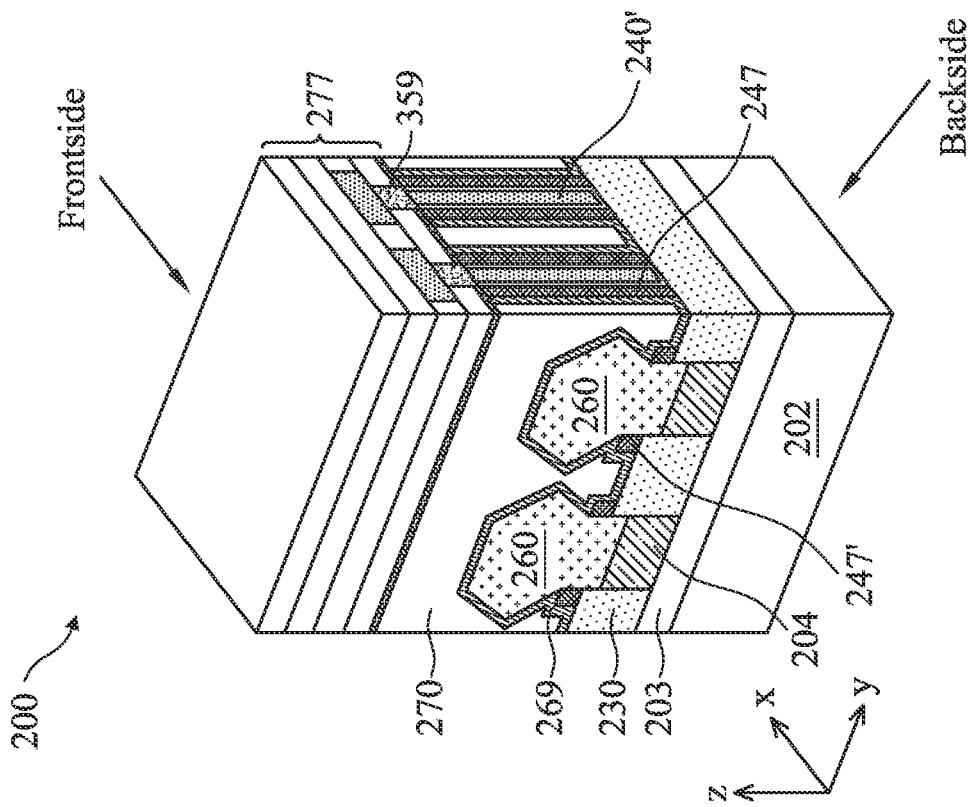

From either the operation 126 (FIG. 1B) or the operation 127 (FIG. 1C), the method 100 proceeds to operation 128 (FIG. 1D) to perform mid-end-of-line (MEOL) processes and back-end-of-line (BEOL) processes at the frontside of the device 200. A resultant structure is shown in FIG. 14 according to an embodiment. For example, the operation 128 may etch S/D contact holes exposing surfaces of some of the S/D features 260, form S/D silicide features (not shown) on surfaces of the S/D features 260 exposed in the S/D contact holes, form S/D contacts (not shown) over the S/D silicide features, form gate vias 359 connecting to the metal gates 240', form S/D contact vias (not shown) connecting to the S/D contacts, and form one or more interconnect layers with wires and vias embedded in dielectric layers. The one or more interconnect layers connecting gate, source, and drain electrodes of various transistors, as well as other circuits in the device 200, to form an integrated circuit in part or in whole. The operation 128 may also form passivation layer(s) over the interconnect layers. In the example shown in FIG. 14, a layer 277 is used to denote various dielectric and metal layers including S/D contacts, S/D vias, gate vias, interconnect layers, and passivation layers formed at the frontside of the device 200.

Figure 15:
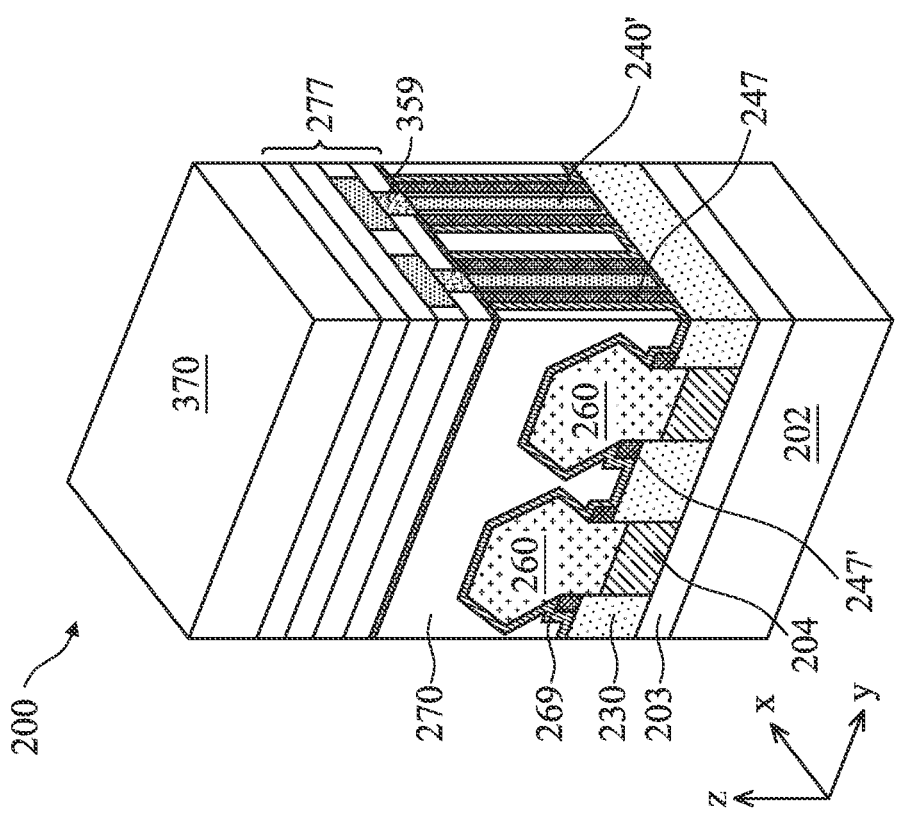

At operation 130, the method 100 (FIG. 1D) attaches the frontside of the device 200 to a carrier 370, such as shown in FIG. 15. The operation 130 may use any suitable attaching processes, such as direct bonding, hybrid bonding, using adhesive, or other bonding methods. The operation 130 may further include alignment, annealing, and/or other processes. The carrier 370 may be a silicon wafer in some embodiment.

Figure 17:
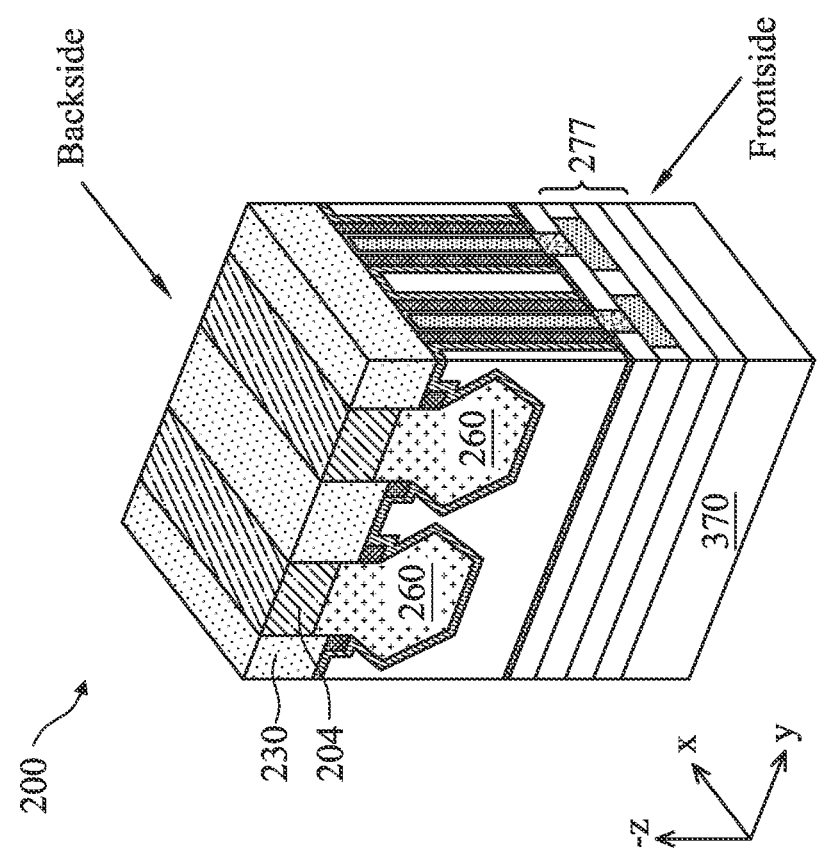
Figure 16:
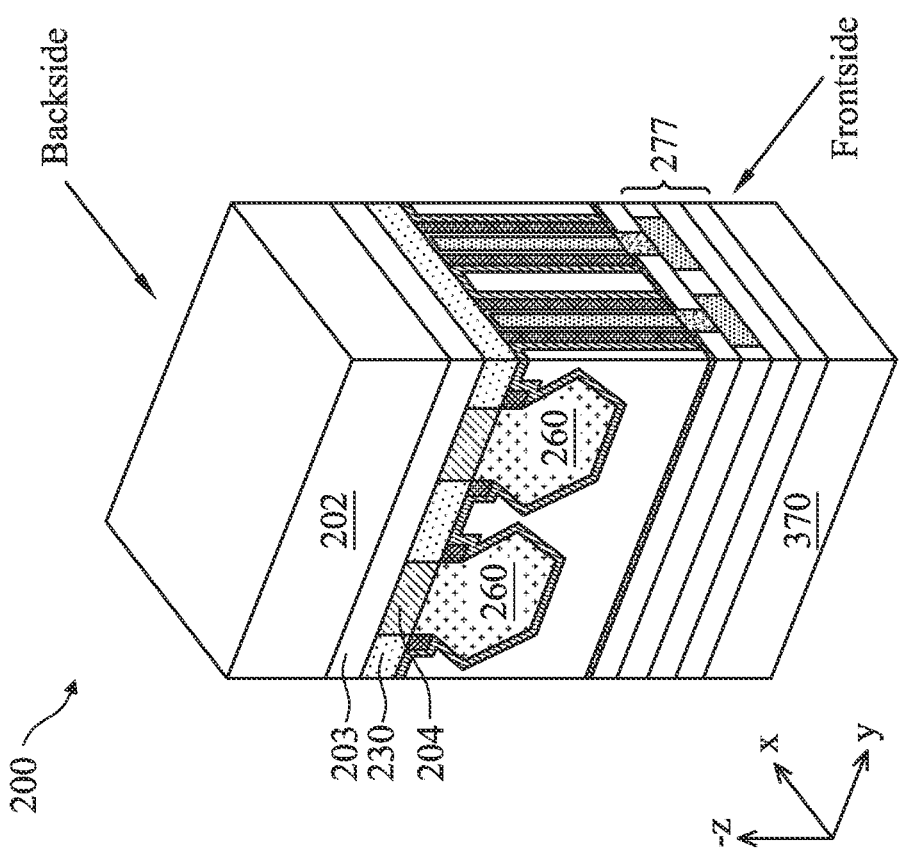

At operation 132, the method 100 (FIG. 1D) flips the device 200 upside down, such as shown in FIG. 16. This makes the device 200 accessible from the backside of the device 200 for further processing. In the figures of the present disclosure, the "z" direction points from the backside of the device 200 to the frontside of the device 200, while the "-z" direction points from the frontside of the device 200 to the backside of the device 200. The operation 132 then thins down the device 200 from its backside until the semiconductor layer 204 and the isolation features 230 are exposed from the backside of the device 200. The resultant structure is shown in FIG. 17 according to an embodiment. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

Figure 18:
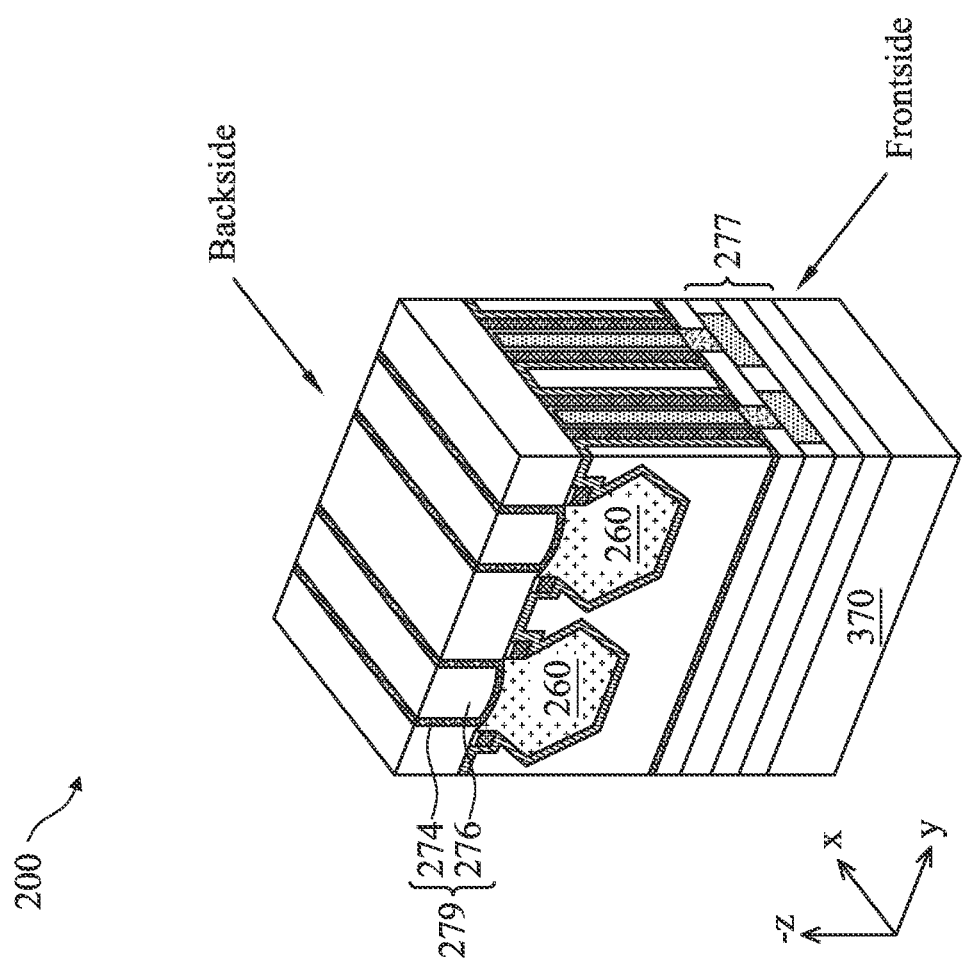

At operation 134, the method 100 (FIG. 1D) replaces the semiconductor fins 204 with dielectric fins 279. The resultant structure is shown in FIG. 18 according to an embodiment. Each dielectric fin 279 includes a dielectric liner 274 and a dielectric filler 276 over the dielectric liner 274. In an embodiment, operation 134 includes selectively removing the semiconductor fins 204 to form trenches and then depositing the dielectric liner 274 and the dielectric filler 276 to fill the trenches. In an embodiment, the operation 134 applies an etching process that is tuned to be selective to the materials of the semiconductor fins 204 (such as Si in an embodiment) and with no (or minimal) etching to the S/D features 260, the dielectric features 285 (or the dielectric features 289 in some embodiments), the isolation features 230, the inner spacers 255, and the fin sidewall spacers 247' if present. The etching process can be dry etching, wet etching, reactive ion etching, or other etching methods. Removing of the semiconductor fins 204 results in trenches. Then, the operation 134 deposits the dielectric liner 274 and the dielectric filler 276 to fill the trenches. In an embodiment, the dielectric liner 274 includes silicon nitride and the dielectric layer(s) 276 includes silicon oxide. In some embodiments, the dielectric liner 274 includes other dielectric materials such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The dielectric liner 274 may have a substantially uniform thickness along the various surfaces of the trenches, and may be formed by CVD, PVD, ALD, or other suitable methods. In some embodiments, the dielectric layer(s) 276 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer(s) 276 may be formed by PECVD (plasma enhanced CVD), FCVD (flowable CVD), or other suitable methods.

In some embodiments, the operation 134 only replaces a part of the semiconductor fins 204 with dielectric fins 279. For example, operation 134 may form a patterned etch mask over the backside of the device 200. The patterned etch mask covers the area under the S/D features 260 that are to be connected to backside vias and exposes the other area. Then, the operation 134 etches the semiconductor fins 204 through the etch mask to form trenches and deposits the dielectric layers 274 and 276 in the trenches. Subsequently, operation 134 removes the etch mask. In such embodiments, the semiconductor fins 204 are partially replaced with the dielectric fins 279. In some embodiments, the operation 134 is optional and may be skipped or omitted in some embodiments of the method 100.

Figure 19B:
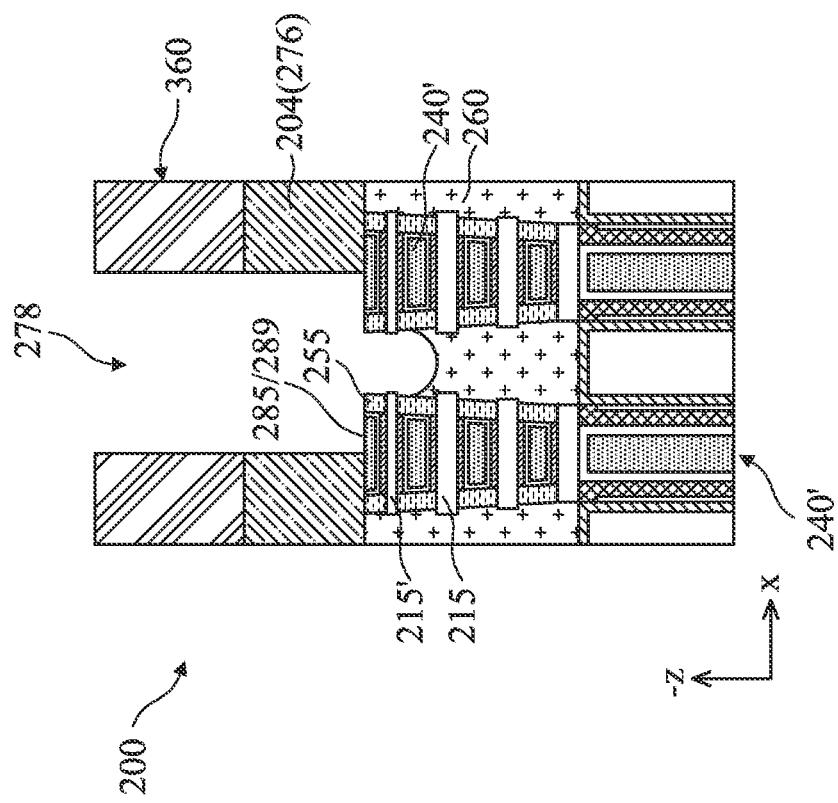
Figure 19A:
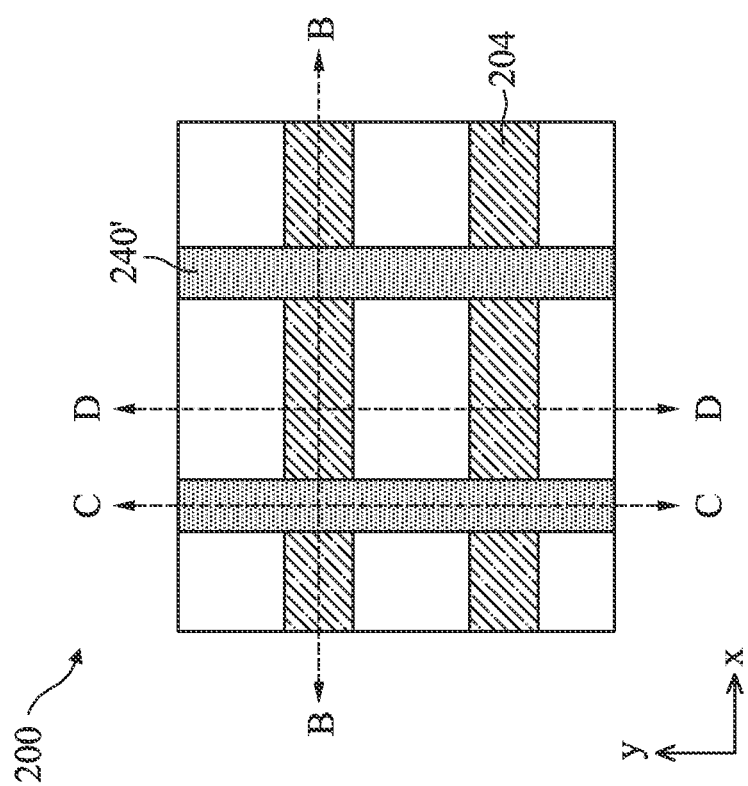
Figure 19D:
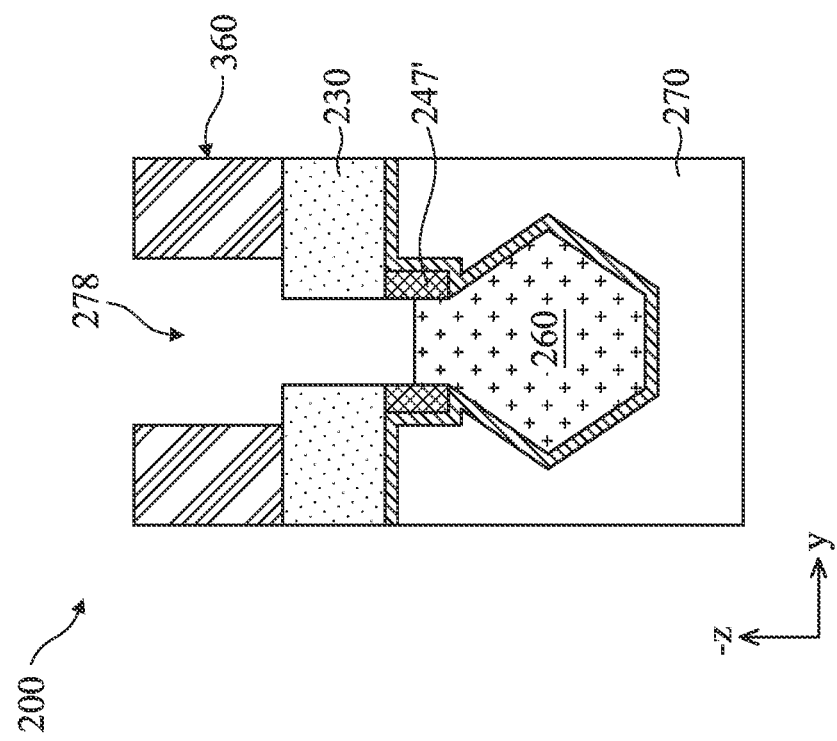
Figure 19C:
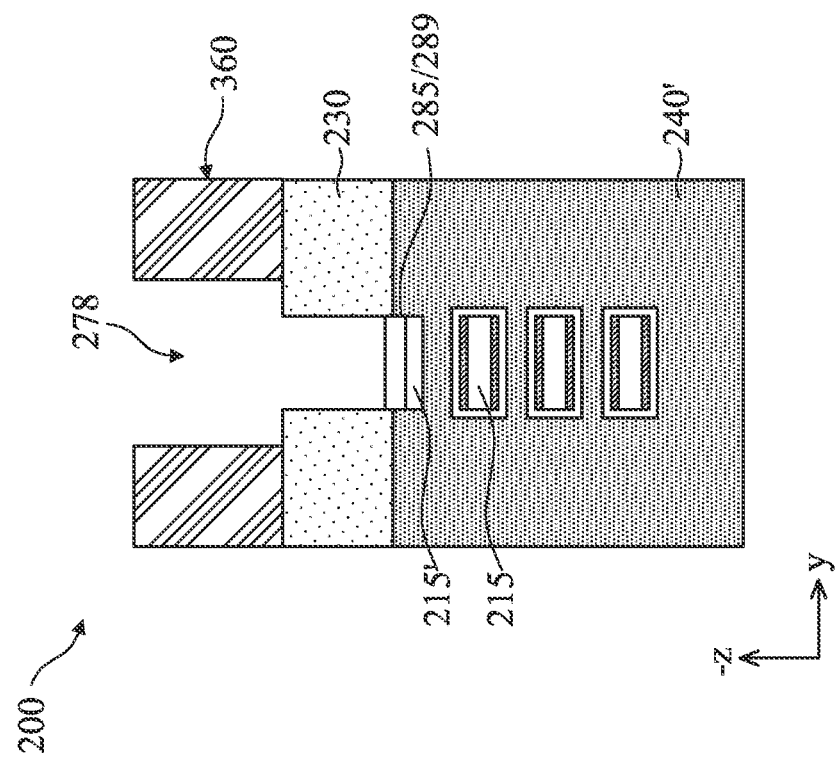

From either the operation 132 (if the operation 134 is skipped) or the operation 134, the method 100 proceeds to operation 136 (FIG. 1D) to etch vias holes 278. The resultant structure is shown in FIGS. 19A-19D according to an embodiment. FIG. 19A illustrates a top view of the device 200, and FIGS. 19B, 19C, and 19D illustrate cross-sectional views of the device 200, in portion, along the B-B line, the C-C line, and the D-D line in FIG. 19A, respectively. As shown in FIG. 19B, the via hole 278 penetrates through either the semiconductor layer 204 (if the operation 134 is skipped) or the dielectric fin 276 (if the operation 134 is performed) in alternative embodiments. Also, the via hole 278 exposes portions of the dielectric features 285 (in embodiments where operations in FIG. 1B are included in the method 100) or the dielectric features 289 (in embodiments where operations in FIG. 1C are included in the method 100).

In the depicted embodiment, operation 136 forms a patterned etch mask 360 over the backside of the device 200. The etch mask 360 exposes the area under the S/D features 260 that are to be connected to backside vias and covers the other area. In various embodiments, the etch mask 360 may expose the backside of source features only, drain features only, or both source and drain features. The etch mask 360 includes a material that is different than a material of the semiconductor fins 204 (or the dielectric fin 276 in an alternative embodiment) to achieve etch selectivity. In an embodiment, the etch mask 360 includes a patterned resist.

Alternatively, the etch mask 360 includes a patterned resist over a patterned hard mask. The present disclosure contemplates other materials for the etch mask 360, so long as etching selectivity is achieved during the etching of the semiconductor fins 204 or the dielectric fins 276. A patterned resist may be formed by a lithography process that includes forming a resist layer, performing a pre-exposure baking process, performing an exposure process, performing a post-exposure baking process, and performing a developing process. Then, operation 136 etches the semiconductor fins 204 (or the dielectric fin 276 in an alternative embodiment) through the etch mask 360 to form the via holes 278. The etching process may partially etch the S/D features 260. The etching process results in via holes 278 that expose the S/D features 260 from the backside of the device 200. The etching process can be dry etching, wet etching, reactive ion etching, or other etching methods. The dielectric features 285 (or the dielectric features 289 in an alternative embodiment) protects the metal gates 240' from the etching process. Particularly, both the dielectric features 285 and the dielectric features 289 include high-k dielectric material(s), which resist the etching process very well. Thus, the dielectric features 285 and the dielectric features 289 provide good protection to the metal gates 240'. In some embodiments when the operation 134 replaces a part of the semiconductor fins 204, the operation 136 removes the rest of the semiconductor fins 204 during the etching of the via holes 278.

Figures 20A, 20B:
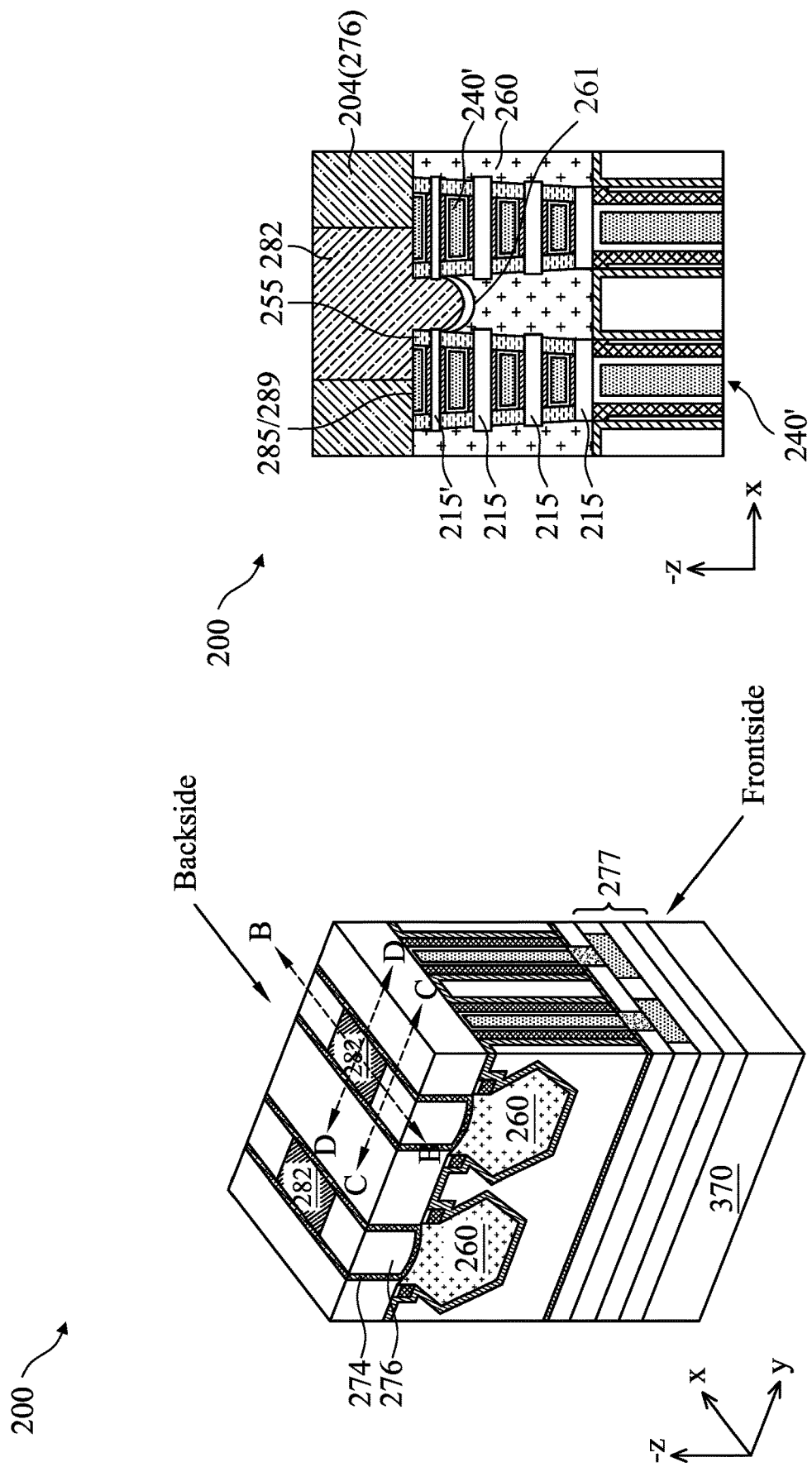
Figure 20D:
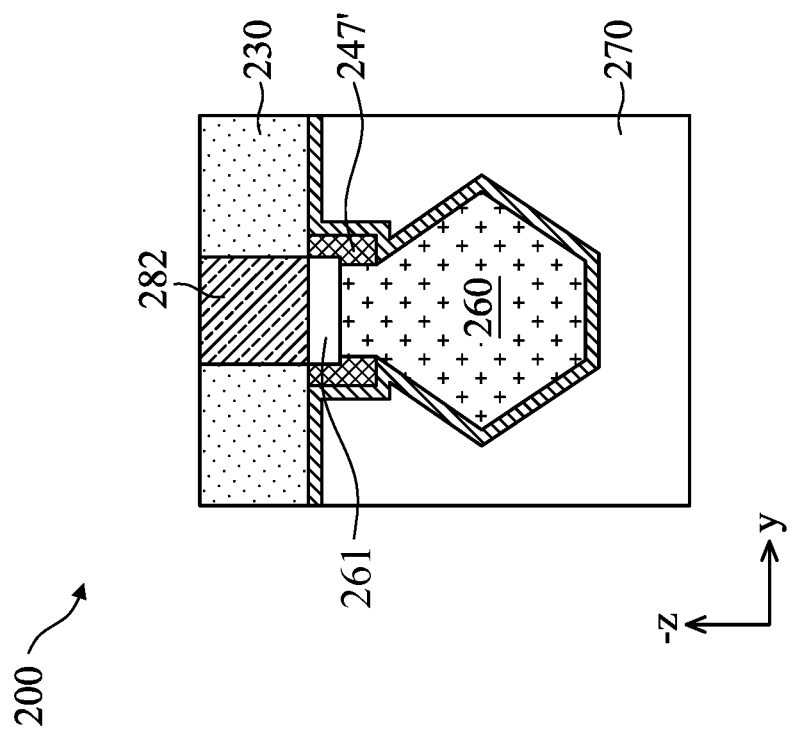
Figure 20C:
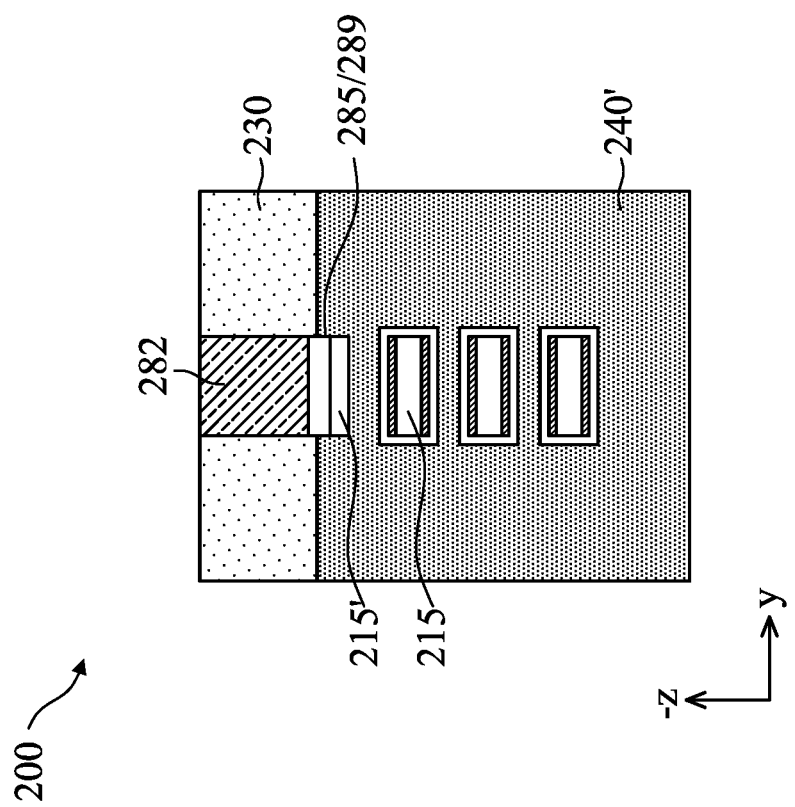

At operation 138, the method 100 (FIG. 1C) forms a backside silicide feature 261 and a backside S/D contact 282. The resultant structure is shown in FIGS. 20A-20D according to an embodiment. FIG. 20A illustrates a perspective view of the device 200, and FIGS. 20B, 20C, and 20D illustrate cross-sectional views of the device 200, in portion, along the B—B line, the C—C line, and the D—D line in FIG. 20A, respectively. As illustrated in FIGS. 20B and 20D, the dielectric features 285 (or the dielectric features 289 in an alternative embodiment) isolate the metal gates 240' from the silicide feature 261 and the S/D contact 282. Further, the low-k dielectric layer 283 in the dielectric features 289 (FIG. 13D) helps reduce the coupling capacitance between the metal gates 240' and the S/D contact 282.

In an embodiment, the operation 138 includes depositing one or more metals into the via holes 278, performing an annealing process to the device 200 to cause reaction between the one or more metals and the S/D features 260 to produce the silicide feature 261, and removing un-reacted portions of the one or more metals, leaving the silicide features 261 in the via holes 278. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 261 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (Yb Si), platinum silicide (PtSi), iridium silicide (IrSi), erbium silicide (ErSi), cobalt silicide (CoSi), or other suitable compounds. In an embodiment, the contact 282 may include a conductive barrier layer and a metal fill layer over the conductive barrier layer. The conductive barrier layer functions to prevent metal materials of the metal fill layer from diffusing into the dielectric layers adjacent the contacts 282, such as the layers 230 and 276. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), copper (Cu), aluminum (Al), titanium (Ti), tantalum (Ta), or other metals, and may be formed by CVD, PVD, ALD, plating, or other suitable processes. In some embodiments, the conductive barrier layer is omitted in the source contact 282. The operation 138 may perform a CMP process to remove excessive materials of the source contact 282. In some embodiments when the operation 134 is skipped, the operation 138 may replace the rest of the semiconductor fins 204 with dielectric fins 279 after the vias 282 are deposited.

Figure 21B:
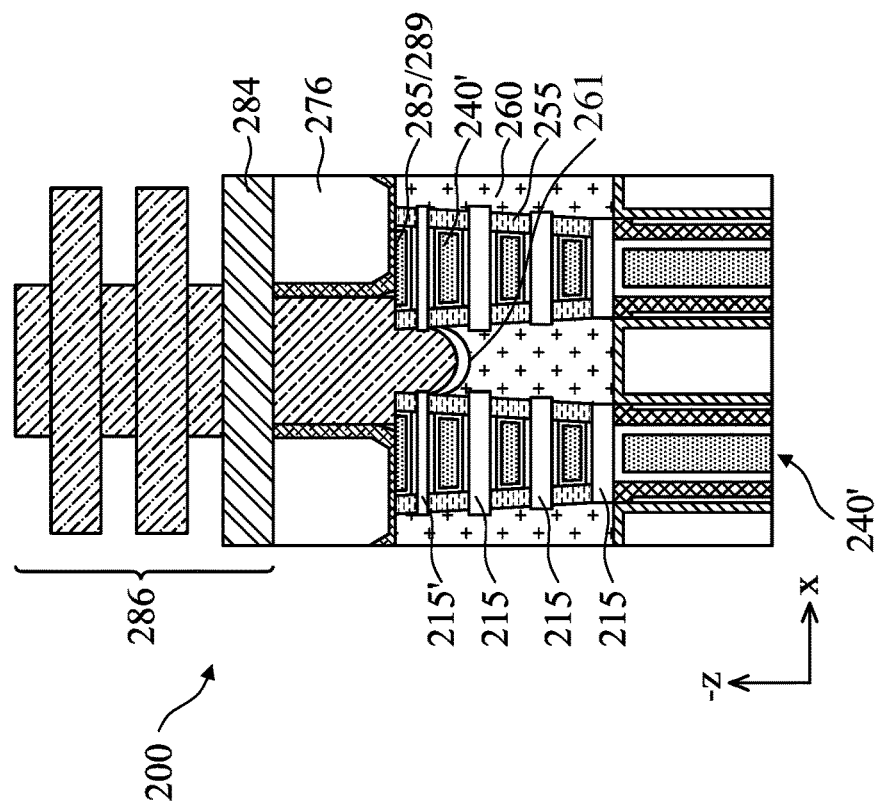
Figure 21A:
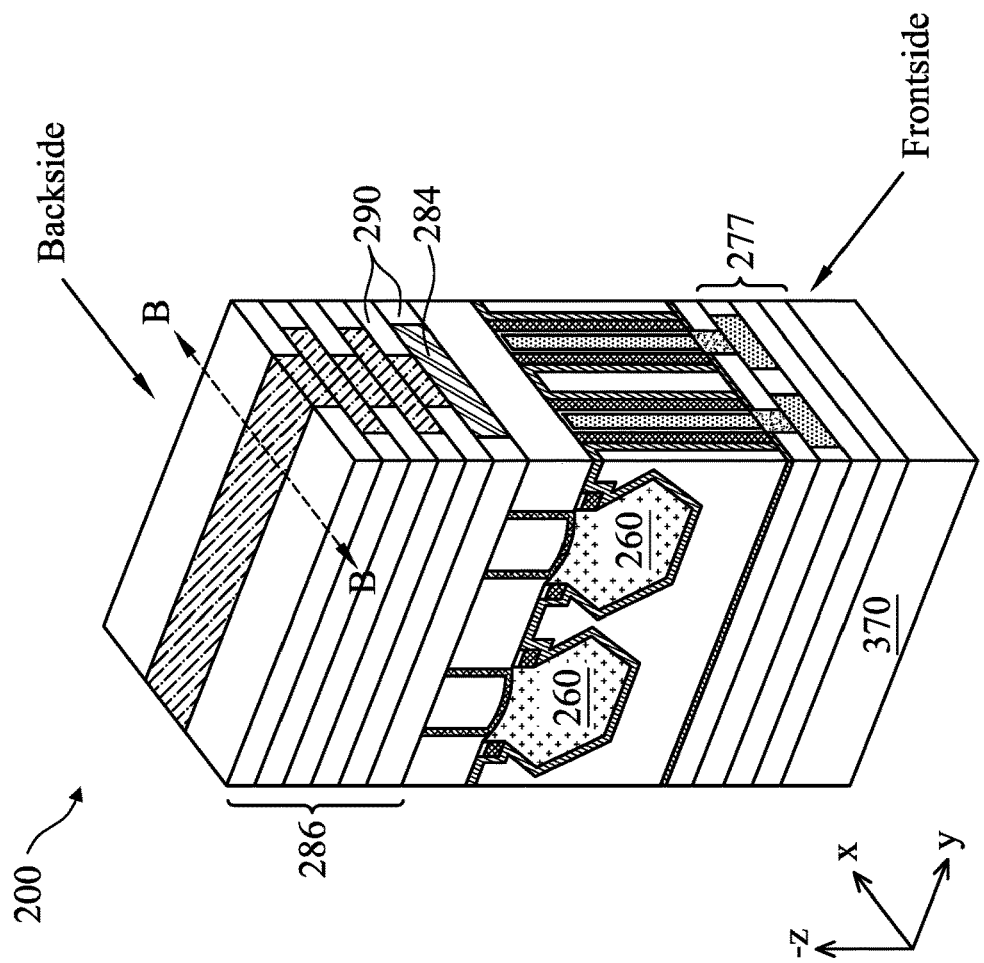

At operation 140, the method 100 (FIG. 1D) forms backside power rails 284 and a backside interconnect 286. The resultant structure is shown in FIGS. 21A and 21B according to an embodiment. FIG. 21A illustrates a perspective view of the device 200, and FIG. 21B illustrates a cross-sectional view of the device 200, in portion, along the B-B line in FIG. 21A. As shown in FIG. 21B, the backside contacts 282 are electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. The backside power rails 284 are embedded in one or more dielectric layers 290. The backside interconnect 286 includes wires and vias embedded in one or more dielectric layers 290. The backside power rails 284 are considered part of the backside interconnect 286. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance.

At operation 142, the method 100 (FIG. 1D) performs further fabrication processes to the device 200. For example, it may form passivation layers on the backside of the device 200, remove the carrier 370, and perform other BEOL processes.

Although not intended to be limiting, embodiments of the present disclosure provide one or more of the following advantages. For example, embodiments of the present disclosure form a dielectric feature which comprises a high-k dielectric material or a low-k dielectric material surrounded by one or more high-k dielectric materials. The high-k dielectric material(s) provide good protection to metal gates during backside via hole etching processes. Also, the dielectric feature provides good isolation between metal gates and backside vias. When the dielectric feature includes a low-k dielectric material surrounded by one or more high-k dielectric materials, it also reduces the coupling capacitance between the metal gates and the backside vias. For another example, embodiments of the present disclosure provide a stack of channel layers with different thicknesses. Particularly, the bottommost channel layer is thinner than other channel layers, thereby reducing leakage due to sub-channel effects. Embodiments of the present disclosure can be readily integrated into existing semiconductor manufacturing processes.

In one example aspect, the present disclosure is directed to a semiconductor device that includes a first interconnect structure; multiple channel layers stacked over the first interconnect structure; a gate stack wrapping around each of the channel layers except a bottommost one of the channel layers; a source/drain feature adjoining the channel layers; a first conductive via connecting the first interconnect structure to a bottom of the source/drain feature; and a dielectric feature between the bottommost one of the channel layers and the first conductive via.

In some embodiments of the semiconductor device, the dielectric feature includes one or more high-k dielectric materials. In a further embodiment, the dielectric feature includes a low-k dielectric material surrounded by the one or more high-k dielectric materials. In another further embodiment, the dielectric feature includes a semiconductor oxide layer between the one or more high-k dielectric materials and the first conductive via.

In an embodiment, the semiconductor device further includes a semiconductor fin structure directly below the channel layers and the source/drain feature, wherein the first conductive via is embedded in the semiconductor fin structure. In another embodiment, the semiconductor device further includes a dielectric fin structure directly below the channel layers and the source/drain feature, wherein the first conductive via is embedded in the dielectric fin structure. In yet another embodiment, the semiconductor device further includes a second interconnect structure above the channel layers, wherein the second interconnect structure includes a second conductive via connecting to a top of the gate stack.

In some embodiments of the semiconductor device, a first vertical spacing between adjacent ones of the channel layers is greater than a thickness of the dielectric feature. In some embodiments, the bottommost one of the channel layers is thinner than other ones of the channel layers.

In another example aspect, the present disclosure is directed to a method that includes providing a structure having a substrate, a first layer over the substrate, an isolation feature adjacent to sidewalls of the first layer, and channel layers over the first layer, wherein the channel layers are spaced vertically away from each other by a first space, and a bottommost one of the channel layers is spaced vertically away from the first layer by a second space thinner than the first space. The method further includes forming an interfacial layer wrapping around each of the channel layers and over the first layer and forming a first high-k dielectric layer over the interfacial layer, wrapping around each of the channel layers, and over the first layer, wherein the interfacial layer and the first high-k dielectric layer collectively completely fill the second space and only partially fill the first space. The method further includes etching the first high-k dielectric layer to remove the first high-k dielectric layer from the first space and to keep a portion of the first high-k dielectric layer in the second space. After the etching of the first high-k dielectric layer, the method further includes forming a second high-k dielectric layer over the channel layers and the first layer and forming a gate electrode over the second high-k dielectric layer.

In some embodiments of the method, the bottommost one of the channel layers is thinner than other ones of the channel layers. In some embodiments, before the forming of the second high-k dielectric layer, the method further includes repairing the interfacial layer. In some embodiments of the method, the second space is thinner than the first space by about 3 nm to 6 nm.

In some embodiments, the method further includes forming an interconnect structure over the gate electrode; thinning down the substrate to expose the first layer and the isolation feature; etching a via hole under the bottommost one of the channel layers; and forming a via structure in the via hole, wherein the portion of the first high-k dielectric layer remains between the bottommost one of the channel layers and the via structure. In a further embodiment, the method includes replacing at least a portion of the first layer with a dielectric feature before the etching of the via hole.

In yet another example aspect, the present disclosure is directed to a method that includes providing a structure having a substrate, a first layer over the substrate, an isolation feature adjacent to sidewalls of the first layer, and channel layers over the first layer, wherein the channel layers are spaced vertically away from each other by a first space, and a bottommost one of the channel layers is spaced vertically away from the first layer by a second space thinner than the first space. The method further includes forming an interfacial layer wrapping around each of the channel layers and over the first layer and forming a first high-k dielectric layer over the interfacial layer, wrapping around each of the channel layers, and over the first layer, wherein the interfacial layer and the first high-k dielectric layer only partially fill the first space and only partially fill the second space. The method further includes forming a first low-k dielectric layer over the first high-k dielectric layer, wherein the interfacial layer, the first high-k dielectric layer, and the first low-k dielectric layer collectively completely fill the second space and only partially fill the first space. The method further includes etching the first low-k dielectric layer to remove the first low-k dielectric layer from the first space and to keep a portion of the first low-k dielectric layer in the second space; forming a second high-k dielectric layer over the first high-k dielectric layer and the first low-k dielectric layer after the etching of the first low-k dielectric layer; and forming a gate electrode over the second high-k dielectric layer.

In some embodiments of the method, the bottommost one of the channel layers is thinner than other ones of the channel layers. In some embodiments, the method further includes forming an interconnect structure over the gate electrode; thinning down the substrate to expose the first layer and the isolation feature; etching a via hole under the bottommost one of the channel layers; and forming a via structure in the via hole, wherein the portion of the first high-k dielectric layer and the first low-k dielectric layer remain between the bottommost one of the channel layers and the via structure. In a further embodiment, the method includes replacing a portion of the first layer with a dielectric feature before the etching of the via hole, wherein the via hole is etched through a remaining portion of the first layer. In another further embodiment, the structure further includes source/drain features over the first layer and connected by the channel layers, wherein the via structure is electrically connected to one of the source/drain features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first interconnect structure;
multiple channel layers stacked over the first interconnect structure;
a gate stack wrapping around each of the channel layers except a bottommost one of the multiple channel layers;
a source/drain feature adjoining the multiple channel layers;
a first conductive via connecting the first interconnect structure to a bottom of the source/drain feature; and
a dielectric feature between the bottommost one of the multiple channel layers and the first conductive via.

2. The semiconductor device of claim 1, wherein the dielectric feature includes one or more high-k dielectric materials.

3. The semiconductor device of claim 2, wherein the dielectric feature further includes a low-k dielectric material surrounded by the one or more high-k dielectric materials.

4. The semiconductor device of claim 2, wherein the dielectric feature further includes a semiconductor oxide layer between the one or more high-k dielectric materials and the first conductive via.

5. The semiconductor device of claim 1, further comprising:
a semiconductor fin structure directly below the multiple channel layers and the source/drain feature, wherein the first conductive via is embedded in the semiconductor fin structure.

6. The semiconductor device of claim 1, further comprising:
a dielectric fin structure directly below the multiple channel layers and the source/drain feature, wherein the first conductive via is embedded in the dielectric fin structure.

7. The semiconductor device of claim 1, further comprising:
a second interconnect structure above the multiple channel layers, wherein the second interconnect structure includes a second conductive via connecting to a top of the gate stack.

8. The semiconductor device of claim 1, wherein a first vertical spacing between adjacent ones of the multiple channel layers is greater than a thickness of the dielectric feature.

9. The semiconductor device of claim 1, wherein the bottommost one of the multiple channel layers is thinner than other ones of the multiple channel layers.

10. A method, comprising:
providing a structure having a substrate, a first layer over the substrate, an isolation feature adjacent to sidewalls of the first layer, and channel layers over the first layer, wherein the channel layers are spaced vertically away from each other by a first space, and a bottommost one of the channel layers is spaced vertically away from the first layer by a second space thinner than the first space;
forming an interfacial layer wrapping around each of the channel layers and over the first layer;
forming a first high-k dielectric layer over the interfacial layer, wrapping around each of the channel layers, and over the first layer, wherein the interfacial layer and the first high-k dielectric layer collectively completely fill the second space and only partially fill the first space;

etching the first high-k dielectric layer to remove the first high-k dielectric layer from the first space and to keep a portion of the first high-k dielectric layer in the second space;

after the etching of the first high-k dielectric layer, forming a second high-k dielectric layer over the channel layers and the first layer; and forming a gate electrode over the second high-k dielectric layer.

11. The method of claim 10, wherein the bottommost one of the channel layers is thinner than other ones of the channel layers.

12. The method of claim 10, before the forming of the second high-k dielectric layer, further comprising:
repairing the interfacial layer.

13. The method of claim 10, further comprising:
forming an interconnect structure over the gate electrode;
thinning down the substrate to expose the first layer and the isolation feature;
etching a via hole under the bottommost one of the channel layers; and
forming a via structure in the via hole, wherein the portion of the first high-k dielectric layer remains between the bottommost one of the channel layers and the via structure.

14. The method of claim 13, further comprising:
before the etching of the via hole, replacing at least a portion of the first layer with a dielectric feature.

15. The method of claim 10, wherein the second space is thinner than the first space by about 3 nm to 6 nm.

16. A method, comprising:
providing a structure having a substrate, a first layer over the substrate, an isolation feature adjacent to sidewalls of the first layer, and channel layers over the first layer, wherein the channel layers are spaced vertically away from each other by a first space, and a bottommost one of the channel layers is spaced vertically away from the first layer by a second space thinner than the first space;
forming an interfacial layer wrapping around each of the channel layers and over the first layer;
forming a first high-k dielectric layer over the interfacial layer, wrapping around each of the channel layers, and over the first layer, wherein the interfacial layer and the first high-k dielectric layer only partially fill the first space and only partially fill the second space;
forming a first low-k dielectric layer over the first high-k dielectric layer, wherein the interfacial layer, the first high-k dielectric layer, and the first low-k dielectric layer collectively completely fill the second space and only partially fill the first space;
etching the first low-k dielectric layer to remove the first low-k dielectric layer from the first space and to keep a portion of the first low-k dielectric layer in the second space;
after the etching of the first low-k dielectric layer, forming a second high-k dielectric layer over the first high-k dielectric layer and the first low-k dielectric layer; and
forming a gate electrode over the second high-k dielectric layer.

17. The method of claim 16, wherein the bottommost one of the channel layers is thinner than other ones of the channel layers.

18. The method of claim 16, further comprising:
forming an interconnect structure over the gate electrode;
thinning down the substrate to expose the first layer and the isolation feature;
etching a via hole under the bottommost one of the channel layers; and
forming a via structure in the via hole, wherein the portion of the first low-k dielectric layer and the first high-k dielectric layer remain between the bottommost one of the channel layers and the via structure.

19. The method of claim 18, further comprising:
before the etching of the via hole, replacing a portion of the first layer with a dielectric feature, wherein the via hole is etched through a remaining portion of the first layer.

20. The method of claim 18, wherein the structure further includes source/drain features over the first layer and connected by the channel layers, wherein the via structure is electrically connected to one of the source/drain features.

* * * * *